United States Patent [19]
Lee et al.

[11] Patent Number: 6,108,490
[45] Date of Patent: Aug. 22, 2000

[54] MULTIZONE ILLUMINATOR FOR RAPID THERMAL PROCESSING WITH IMPROVED SPATIAL RESOLUTION

[75] Inventors: Yong Jin Lee, Palo Alto; Mehrdad M. Moslehi, Los Altos, both of Calif.; Xiangqun Chen, Plano, Tex.

[73] Assignee: CVC, Inc.

[21] Appl. No.: 09/209,313

[22] Filed: Dec. 9, 1998

Related U.S. Application Data

[63] Continuation-in-part of application No. 08/678,321, Jul. 11, 1996.

[51] Int. Cl.⁷ ..................................................... A21B 2/00
[52] U.S. Cl. ......................... 392/416; 219/390; 118/724; 392/418
[58] Field of Search .................................. 219/390, 405, 219/411; 392/411, 416, 418, 422, 423, 424; 118/724, 725, 730, 50.1; 250/492.22, 495.1; 438/799

[56] References Cited

U.S. PATENT DOCUMENTS

| | | | |
|---|---|---|---|
| 3,761,678 | 9/1973 | Eckles | 219/343 |
| 4,047,496 | 9/1977 | McNeilly et al. | 118/49.1 |
| 4,640,224 | 2/1987 | Bunch et al. | 118/725 |
| 4,649,261 | 3/1987 | Sheets | 219/390 |
| 4,752,592 | 6/1988 | Tamura et al. | 437/247 |
| 4,796,562 | 1/1989 | Brors et al. | 118/725 |
| 4,818,327 | 4/1989 | Davis et al. | 156/345 |
| 4,830,700 | 5/1989 | Davis et al. | 156/345 |
| 4,832,777 | 5/1989 | Davis et al. | 156/345 |
| 4,891,499 | 1/1990 | Moslehi | 219/502 |
| 4,956,538 | 9/1990 | Moslehi | 219/121.6 |
| 5,156,461 | 10/1992 | Moslehi et al. | 374/121 |
| 5,156,820 | 10/1992 | Wong et al. | 422/186.05 |
| 5,179,677 | 1/1993 | Anderson et al. | 392/411 |
| 5,228,114 | 7/1993 | Suzuki | 392/416 |
| 5,255,286 | 10/1993 | Moslehi et al. | 374/121 |
| 5,268,989 | 12/1993 | Moslehi et al. | 392/418 |
| 5,305,417 | 4/1994 | Najm et al. | 392/418 |
| 5,308,161 | 5/1994 | Stein | 374/5 |
| 5,317,656 | 5/1994 | Moslehi et al. | 385/12 |
| 5,367,606 | 11/1994 | Moslehi et al. | 392/418 |
| 5,436,172 | 7/1995 | Moslehi | 437/8 |
| 5,443,315 | 8/1995 | Lee et al. | 374/126 |
| 5,444,815 | 8/1995 | Lee et al. | 392/416 |
| 5,445,677 | 8/1995 | Kawata et al. | 118/724 |
| 5,446,825 | 8/1995 | Moslehi et al. | 392/416 |
| 5,467,220 | 11/1995 | Xu | 359/350 |
| 5,480,489 | 1/1996 | Hasegawa et al. | 118/725 |
| 5,487,127 | 1/1996 | Gronet et al. | 392/416 |
| 5,551,985 | 9/1996 | Brors et al. | 118/725 |
| 5,603,772 | 2/1997 | Ide | 118/724 |
| 5,689,614 | 11/1997 | Gronet et al. | 392/416 |
| 5,930,456 | 7/1999 | Vosen | 392/416 |

*Primary Examiner*—Teresa Walberg
*Assistant Examiner*—Shawntina Fuqua
*Attorney, Agent, or Firm*—Gray Cary Ware & Freidenrich LLP

[57] ABSTRACT

A system for rapid thermal processing of a substrate in a process chamber while measuring and controlling the temperature at the substrate to establish substantially uniform substrate temperature in real time. The system includes an essentially continuous spirally-configured multizone illuminator having a plurality of substantially concentric rings of heating lamps for directing optical power toward the substrate and a fluid cooled optical reflector facing the substrate frontside and having a relatively high optical reflectivity. The illuminator can also be offset from the geometric center of the substrate. The system can also include a plurality of contact devices to provide thermal conductivity from each, or some subset, of the plurality of heating lamps. The illumination system of the present invention provides improved spatial resolution and improved thermal properties at the heating lamps.

48 Claims, 13 Drawing Sheets

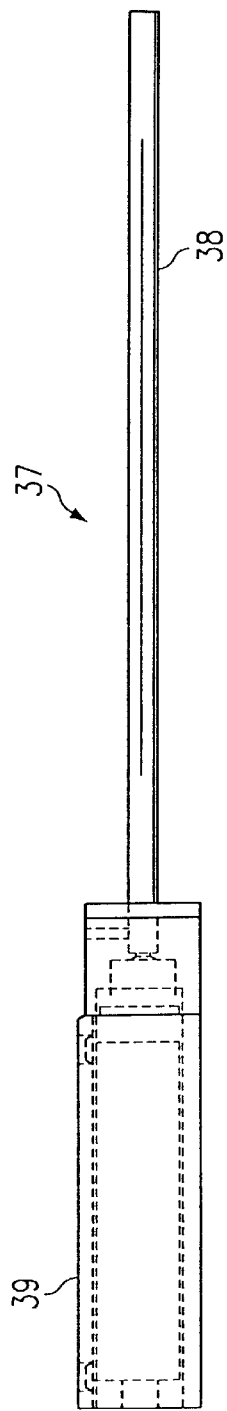
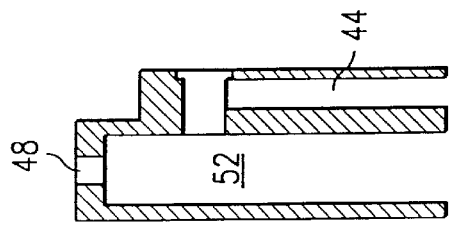
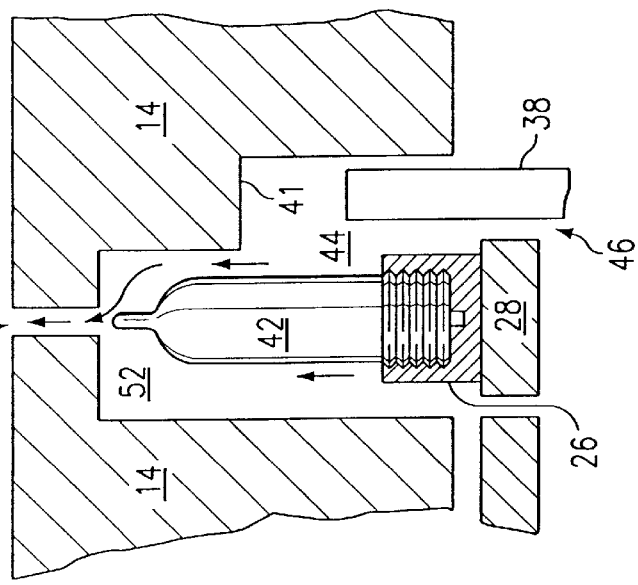

MULTIZONE ILLUMINATOR FOR RAPID THERMAL PROCESSING WITH IMPROVED SPATIAL RESOLUTION

RELATED PATENT APPLICATIONS

This application claims priority as a continuation in-part of U.S. patent application Ser. No. 08/678,321 entitled "Multi-Zone Illuminator for Rapid Thermal Processing," filed on Jul. 11, 1996.

TECHNICAL FIELD OF THE INVENTION

The present invention relates to a method and system for semiconductor device fabrication and, more particularly, to a multizone illuminator for advanced rapid thermal processing equipment having embedded sensors including pyrometry sensors.

BACKGROUND OF THE INVENTION

Single-wafer rapid thermal processing (RTP) of semiconductors provides a powerful and versatile technique for fabrication of very-large-scale-integrated (VLSI) and ultra-large-scale-integrated (ULSI) electronic devices. RTP combines low thermal mass photon-assisted rapid wafer heating with inert or reactive ambient semiconductor wafer processing.

Rapid thermal processing (RTP) of semiconductor wafers provides a capability for improved wafer-to-wafer process repeatability in a single-wafer lamp-heated thermal processing reactor. RTP systems mostly employ illuminators consisting of an array of tungsten halogen lamps to heat a semiconductor wafer either directly or through a graphite susceptor in a cold-wall process chamber. Conventional RTP systems typically employ illuminators that provide single-zone or very limited asymmetrical multizone control capability. Thus, an increase or decrease of power to the illuminator affects the entire wafer temperature distribution and uniformity. In general, the existing commercial RTP systems in the market can be divided into the following four categories:

(1) Top and bottom wafer heating using two arrays of linear tungsten halogen lamps. This type of RTP system configuration has traditionally dominated in the market (offered by RTP vendors such as AG Associates of U.S.A., AST of Germany; and DaiNippon Screen of Japan). In this configuration, the substrate (typically a semiconductor wafer) is placed in an atmospheric quartz chamber and is heated from both frontside and backside by two arrays of linear tungsten halogen lamps. As a result, these systems employ non-axisymmetrical illuminators, usually to heat a stationary (non-rotating) wafer.

These systems lack the essential requirements such as multi-point sensors and energy source (illuminator) axisymmetry for effective wafer temperature uniformity and repeatability control. While these RTP systems can be used for anneal (RTA or Rapid Thermal Anneal) and oxidation (RTO or Rapid Thermal Oxidation) processes, they cannot be used for Rapid Thermal Chemical-Vapor Deposition (RTCVD) applications.

In addition to the temperature uniformity and repeatability problems, these RTP system designs also suffer from localized temperature and process nonuniformities due to device or chip pattern effects. The device patterns on the wafer frontside (produced by the deposition, microlithography, and etch steps) produce different total and spectral emissivities on the wafer frontside. The regions with varying frontside emissivities (and absorptivities) absorb different amounts of photon energy or light flux from the radiative tungsten halogen lamps, resulting in different thermal responses. Moreover, the wafer frontside region with different device pattern-induced emissivities will dissipate different amounts of energy by optical radiation. This is due to the fact that the amount of radiative power loss P per unit area from the surface of an object with a temperature T (temperature in Kelvin) and a total emissivity of $\epsilon$ is as follows:

$$P = \epsilon \sigma T^4$$

where $\sigma$ is the Stefan Boltzmann Constant. Thus, the wafer pattern effects due to the chip patterns on the wafer frontsides can cause serious localized temperature non-uniformity problems, resulting in process nonuniformities, degradation of process repeatability, and even formation of slip dislocation.

(2) Top wafer heating using a single array of linear tungsten halogen lamps. This type of RTP system design has been introduced (for instance by AG Associates of U.S.A.) for RTCVD applications. A common configuration for this type of RTP system employs a quartz showerhead between the optical quartz window and the wafer within a cold-wall RTP process chamber. These systems may use wafer rotation through a ferrofluidic feedthrough from the chamber bottom. For this type of RTP system design, wafer rotation may somewhat alleviate the temperature and process non-uniformity problems associated with the use of non-axisymmetrical illuminator designs; it does not, however, solve the problem completely. Lack of illuminator design axisymmetry and lack of appropriate emissivity compensated multi-point pyrometry result in fundamental limitations and problems. These systems also suffer from the frontside pattern-induced temperature and process non-uniformities described earlier. Another significant problem with this type of RTP design is equipment state drift and process non-uniformity problems due to depositions on the quartz showerhead in RTCVD applications. Since the quartz showerhead is placed between the semiconductor wafer inside the process chamber and the external non-axisymmetrical illuminator used for frontside/top side wafer heating, any unwanted depositions on the quartz showerhead will affect the amount of optical power absorption by the semiconductor wafer.

(3) Two-sided tungsten-halogen lamp heating combined with a heated wafer susceptor. Some commercial RTP systems, (Applied Materials of U.S.A. and ASM of the Netherlands have introduced RTP systems based on this type of design for silicon epitaxy and polysilicon deposition (RTCVD) applications) employ a holding wafer susceptor made of a light-absorbing material such as graphite, silicon-carbide-coated graphite, or silicon carbide. These systems rely on the use of a relatively high-thermal mass heated susceptor in order to partially overcome the temperature non-uniformity and process repeatability problems. Although the use of a heated susceptor may reduce these problems, it does not completely eliminate them. Moreover, the use of a heated susceptor may introduce some new problems. For instance, in RTCVD applications, the heated susceptor can be coated by the material being deposited on the wafer (e.g., doped or undoped polysilicon; silicon dioxide; silicon nitrate; etc.). The unwanted depositions on the susceptor can result in particulate generation, cross contamination process uniformity drifts, as well as temperature measurement and process control problems. Temperature movement and control in these RTP systems is usually based on the use of pyrometry for measuring the susceptor temperature (or embedded thermocouple in the susceptor). The pyrometry measurements may experience significant errors due to the emissivity validations caused by the unwanted depositions on the susceptor. The RTP systems with this type of design may also employ wafer rotation to improve process uniformity. Again, however, as outlined in the previous RTP systems, while wafer rotation may somewhat alleviate the temperature and process non-uniformity problems associated with the use of non-axisymmetrical illuminator designs, it does not solve the problem completely. The use of a heated susceptor has another major disadvantage since it slows down the temperature control dynamics by reducing the maximum achievable heat-up and cool-down rates by a significant margin. This results in the degradation of the process throughput and an increase in cost-of ownership (COO).

(4) Hot wall RTP with a graded-zone single-wafer furnace. Eaton Thermal Processing Systems (formerly High-Temperature Engineering) of U.S.A. has introduced an RTP system based on the use of a graded-temperature resistivity-temperature hot-wall furnace. Wafer heating and cooling cycles are performed by rapidly moving a wafer between the furnace cold and hot zones. Although this type of system can provide good steady-state temperature uniformity, it lacks the means for transient dynamic uniformity control. Another disadvantage of this type of RTP system design is the need for rapid large-scale mechanical movement of the wafer in order to ramp-up or ramp-down the wafer temperatures. Moreover, this type of RTP system design can still experience localized temperature and process uniformity problems due to the device patterns effects.

In addition to the uniformity problems, conventional RTP systems also experience problems making accurate temperature measurements. Currently, the majority of RTP systems rely on pyrometric temperature measurements. Pyrometric measurements, however, have several limitations. One of the most important limitations is that the temperature measurements are dependent on the emissivity of the wafer. The emissivity is a function of various wafer states including thin films, substrate doping, and backside roughness. Emissivity is also dependent on temperature. Another important limitation of pyrometric temperature measurement in lamp heated semiconductor processing is that there is a spectral overlap between radiation from the lamps used to heat the wafer and the radiation from the wafer used to measure temperature. The pyrometer cannot distinguish between the radiation from these two sources, and thus error is introduced into temperature measurement. The error is particularly significant at low wafer temperatures during temperature ramp-up where thermal radiation from the wafer is limited but lamp radiation is significant. Lamp radiation often provides a major obstacle in making accurate measurements of temperatures below 500° C. using pyrometric techniques.

SUMMARY OF THE INVENTION

Therefore a need has arisen for an improved rapid thermal processing (RTP) multizone illumination system and method for microelectronics manufacturing equipment that incorporates embedded sensors for precision temperature control.

A need exists for an improved RTP illuminator system and method and an improved RTP equipment configuration that provides precision control of the RTP process uniformity, effective wafer temperature uniformity and process repeatability.

A further need exists for an improved RTP illuminator system and method and an improved RTP equipment configuration that eliminates the frontside pattern effects on temperature and process uniformity.

A need exists for an improved RTP illuminator system and method and an improved RTP equipment configuration that can meet process performance and process control requirements for RTA, RTO, as well as RTCVD applications.

A further need exists for an improved RTP illuminator system and method and an improved RTP equipment configuration that enables relatively high heat-up and cool-down rates.

A need exists for an improved RTP illuminator system and method and an improved RTP equipment configuration that facilitates integration of multipoint temperature sensors to enable dynamic real-time multizone control of wafer temperature.

Moreover, a need exists for an improved RTP illuminator system and method and an improved RTP equipment configuration that provides equipment extendibility to larger-wafer (300 mm and beyond) processing applications via simple scaling design rules.

Additionally, a need exists for an improved RTP illuminator system and method and an improved RTP equipment configuration that can establish improved built-in equipment reliability and uptime.

An improved RTP illuminator system is needed having enhanced spatial resolution for distributing optical energy to a substrate, the spatial resolution being reduced for a given spacing between heating lamps or adjacent zones of heating lamps.

A further need exists for an improved RTP illuminator having reconfigurable zones for illuminating a substrate and measuring and controlling the heating of the substrate.

In accordance with the present invention, an axisymmetric RTP illuminator system and method and an RTP equipment configuration are provided that substantially eliminate or reduce disadvantages and problems associated with previously developed RTP systems.

More specifically, a system is provided for rapid thermal processing of a substrate in a process chamber while measuring and controlling the temperature at the substrate to establish substantially uniform substrate temperature in real time. The system includes an axisymmetrical multizone illuminator having a plurality of substantially concentric rings of heating lamps to direct optical power toward said substrate, a fluid cooled optical reflector facing the substrate frontside and having a relatively high optical reflectivity. The system also includes a multizone temperature measurement system having a plurality of pyrometry sensors coupled to said multizone illuminator, a system for real-time measurement and compensation of substrate emissivity and illuminator lamp light interference effects, and a multivariable temperature controller for providing multizone real-time temperature control. The system also incorporates a plurality of illuminator lamp power supplies.

In one embodiment, the system comprises an off-axis illuminator having a geometric center which is offset laterally from the center of the substrate or wafer being illuminated so that rotation of the substrate relative to the illuminator results in a smooth thermal profile applied to the substrate. The center axis of the illuminator can be offset from the rotational axis of the substrate or wafer by a distance proportional to the spacing between each zone, usually a fraction of inner zone spacing distance, such as a distance of less than one inch. To provide consistent heating across the substrate, the illuminator generally has a diameter which is 50 to 100 percent larger than the diameter of the substrate.

In another embodiment the system comprises a plurality of heating lamps configured in a spiral-shape to enhance the spatial resolution of the thermal profile provided by the illuminator. The spiral-shape provides spatial sweeping action when the substrate is rotated relative to the illuminator. The lamps can be divided into variable radius zones to control the time average optical flux for each zone and the regions between the zones. The zones can have a variable radius by reconfiguration of the zones, accomplished through a reorganization of power sources and temperature sensors. The ability to reconfigure zones can be enhanced by applying spiral shapes with varying densities of lamps and varying divergence of the lamps from the center of the spiral shape, including spiral of Archimedes, logarithmic spiral, and hyperbolic spiral shapes, and also including three dimensional spiral shapes when the effective distance between the lamps and the substrate varies.

Any of these embodiments can incorporate cooling devices coupled to the illuminator heat lamps to dissipate heat from the lamps to the body of the illuminator. These cooling devices can take the form of metallic (for example, stainles steel) "fingers" coupled between the body of the illuminator and the base of the heat lamps.

An important technical advantage of the present invention is that it provides dynamic multizone temperature and heating process uniformity across a semiconductor wafer during manufacture of the wafer.

Another technical advantage of the present invention is that it provides first-order axisymmetric heating to provide temperature and heating process uniformity across a semiconductor wafer.

The present invention provides another technical advantage by providing precise control of the RTP process uniformity and process repeatability.

The present invention provides another technical advantage by eliminating the frontside pattern effects on temperature and process uniformity.

Another technical advantage of the present invention is the ability to meet process performance and process control requirements for RTA, RTO, as well as RTCVD applications.

Still another technical advantage of the present invention is that it does not significantly reduce the maximum achievable heat-up and cool-down rates.

The present invention provides yet another technical advantage by providing equipment extendibility to larger-wafer (300 mm and beyond) processing applications via simple scaling design rules.

The present invention provides yet another technical advantage by measuring wafer temperature while accurately adjusting for the emissivity and lamp radiation effects.

The present invention provides another technical advantage by enhancing the spatial resolution of an illuminator for a given zone spacing to provide precise substrate temperature control without an increased number of heating lamps.

The present invention provides yet another technical advantage by allowing reconfiguration of the heating zones, such as changes to the diameter of the dimensions of the heating zones, thus increasing the utility of an illuminator for different heating applications.

Still another technical advantage that the present invention provides is the ability to more rapidly and more effectively transfer heat from those components of the illuminator of the present invention that would receive light and become heated.

BRIEF DESCRIPTION OF THE DRAWINGS

For a more complete understanding of the present invention and the advantages thereof, reference is now made to the following description which is to be taken in conjunction with the accompanying drawings.

FIG. 6 shows a schematic diagram of a reference or dummy lamp cavity with a reference bulb and a lightpipe;

FIG. 7 presents another embodiment of a reference or dummy lamp cavity that can be used in conjunction with the present invention;

FIG. 8 depicts an embodiment of a multiprobe having a lightpipe and an electronic assembly for use as a probe in the present invention;

DETAILED DESCRIPTION OF THE INVENTION

Preferred embodiments of the present invention are illustrated in the FIGUREs like numerals being used to refer to like and corresponding parts of the various drawings.

The present invention relates to a first-order axisymmetrical multizone illuminator having embedded sensors for advance RTP applications that provides uniform thermal processing and accurate temperature measurement over a semiconductor wafer during manufacture. The present invention can perform multizone heating of the backside of a wafer in conjunction with an optically reflecting object facing the wafer frontside in order to eliminate the device patterns effects on wafer temperature and process uniformity. The present invention also includes multiple sensors, including pyrometric temperature sensors, embedded within the multizone illuminator housing of the present invention for taking wafer and state measurements in an RTP process chamber.

The multizone illuminator is used to control the temperature and the temperature uniformity of the heated substrate in an RTP process. The illuminator showerhead (the actuator) can work in conjunction with temperature sensors and a controller to provide optimal closed-loop control of the substrate temperature. The key criteria for an ideal illuminator showerhead design include:

Providing adequate separation between the multiple zones of heating to allow independent control of the temperature as function of radial position.

Providing adequate overlap of radiation pattern between the multiple zones to provide smooth temperature transition between radial zones on the wafer.

Providing adequate azimuthal uniformity to allow uniform azimuthal heating of the substrate without substrate rotation.

Providing adequate optical power, as well as adequate optical power density to achieve the required substrate temperatures and temperature ramp rates.

Incorporating reference bulbs for enhanced pyrometric temperature measurement of the substrate. Accommodating lightpipes used for temperature measurements.

Providing easy identification and replacement of defective bulbs.

Allowing adjustment in lateral and horizontal position of the illuminator with respect to the substrate.

Providing improved spatial resolution of the heat profile at the substrate.

Figure 1:
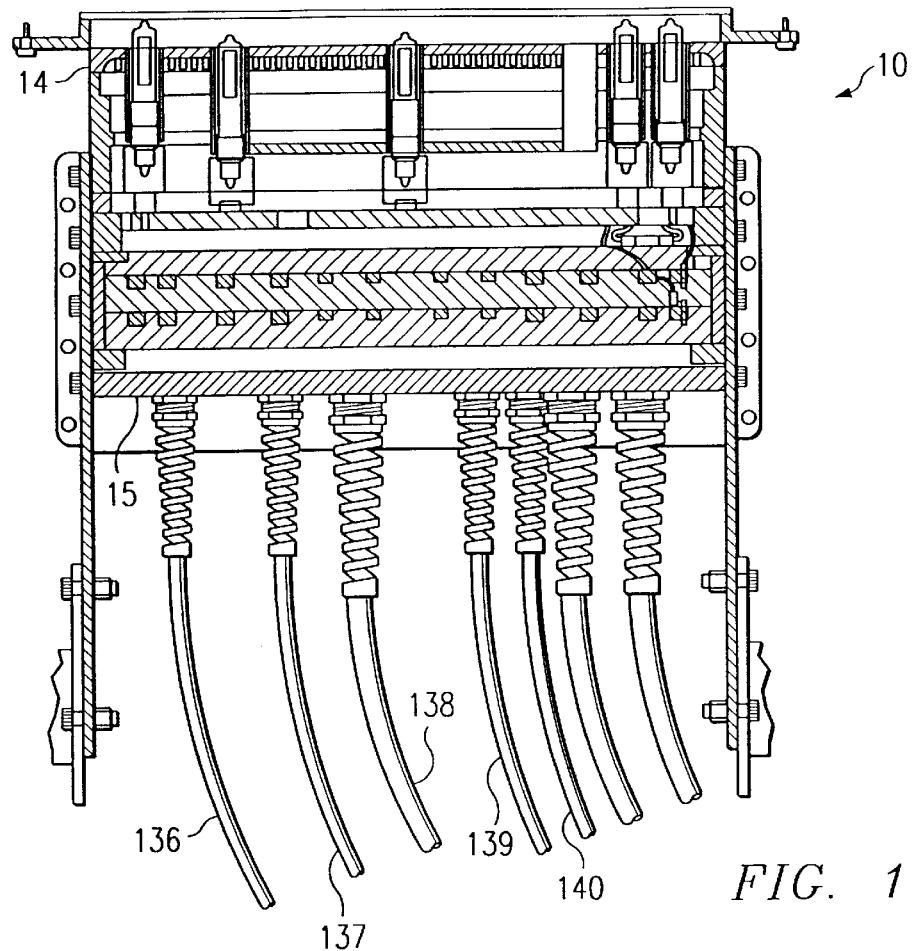
FIG. 1 presents a side cut-away view for one embodiment of the multizone illuminator of the present invention.

FIG. 1 shows one embodiment of the multizone illuminator 10 of the present invention that includes an illuminator housing 14, base plate 15, and power connections 136, 137, 138, 139, and 140. Another embodiment of the present invention having improved spatial resolution is described below in FIGS. 13 through 15 and the accompanying text.

Figure 2:
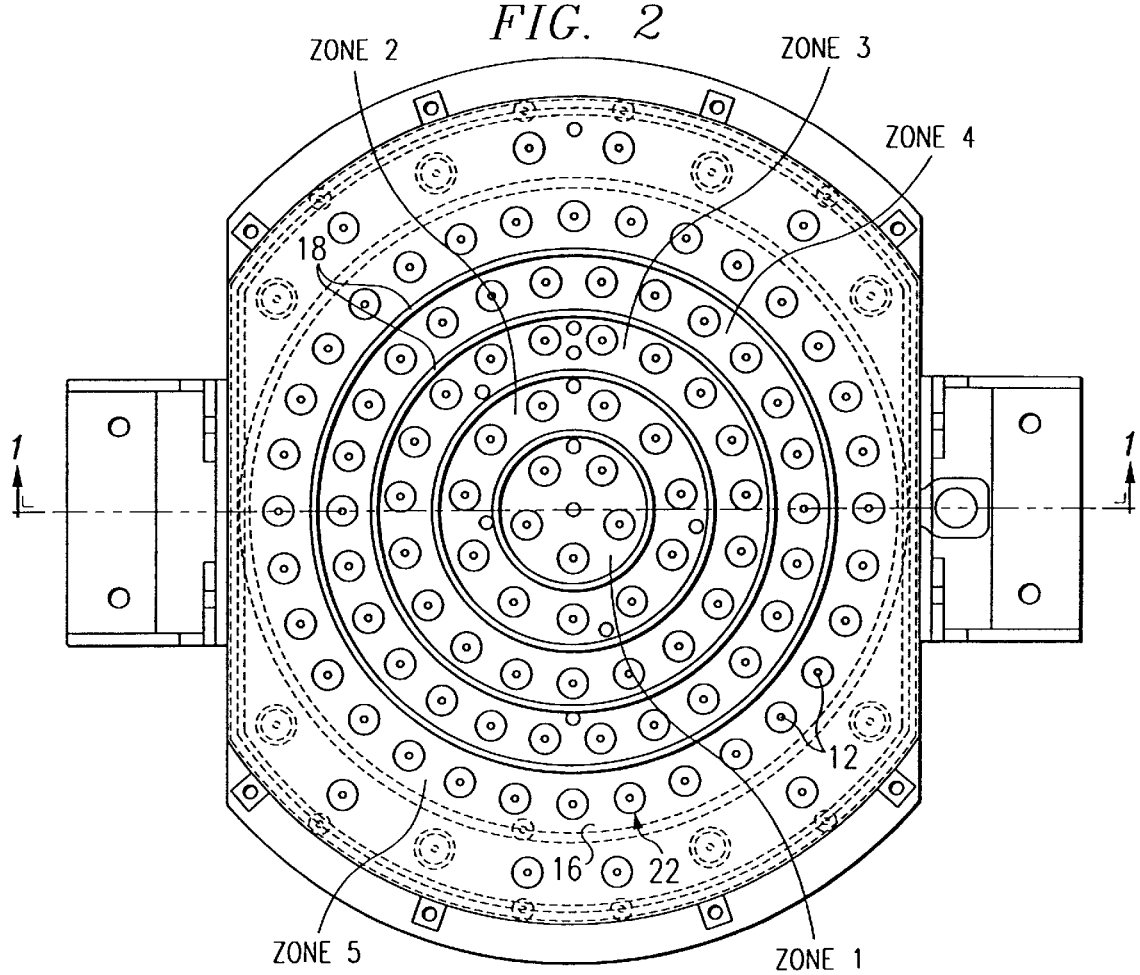
FIG. 2 shows a top view of one embodiment of the multizone illuminator of type appearing in FIG. 1.

FIG. 2 shows a top view of the FIG. 1 embodiment that includes multiple rings of heating lamps 12, a fluid cooled reflector 16, and a plurality of spacer rings 18 to optimize the inter-zone optical flux interaction. Each concentric ring of heating lamps 12 represents a "zone" of heating. FIG. 2 shows a five zone illuminator (zones labeled zone 1–5). Connection 136 provides power to lamps 12 in zone 1, connection 137 provides power to lamps 12 in zone 2, connection 138 provides power to lamps 12 in zone 3, connection 139 provides power to lamps 12 in zone 4, and connection 140 provides power to lamps 12 in zone 5. Five concentric axisymmetric zones of tungsten-halogen lamps may be used for establishing dynamic multizone temperature uniformity control on 200-mm semiconductor wafers. The axisymmetrical multizone illuminator (with five circular zones of tungsten-halogen lamps for, 200 mm wafer heating) can be used to heat the wafer from the backside through a quartz window. In a particular embodiment, the five-zone illuminator employs a total of 93 tungsten-halogen bulbs in five circular zones for uniform heating of wafers up to 200 mm in diameter. It is expected that for future 300 mm diameter wafers, scaled-up embodiments of the present invention will employ seven or more illuminator zones and seven or more emissivity compensated pyrometry probes for complete temperature uniformity and repeatability control.

In order to provide adequate heating power to the substrate, the lamps 12 must be closely grouped on the multizone illuminator 10. The dense packing of the bulbs 12 requires designing a system for cooling the lamps 12. The present invention incorporates both water and air cooling to use thermal conduction, convection, and radiation to provide proper thermal management of the lamps 12.

Figure 3A:
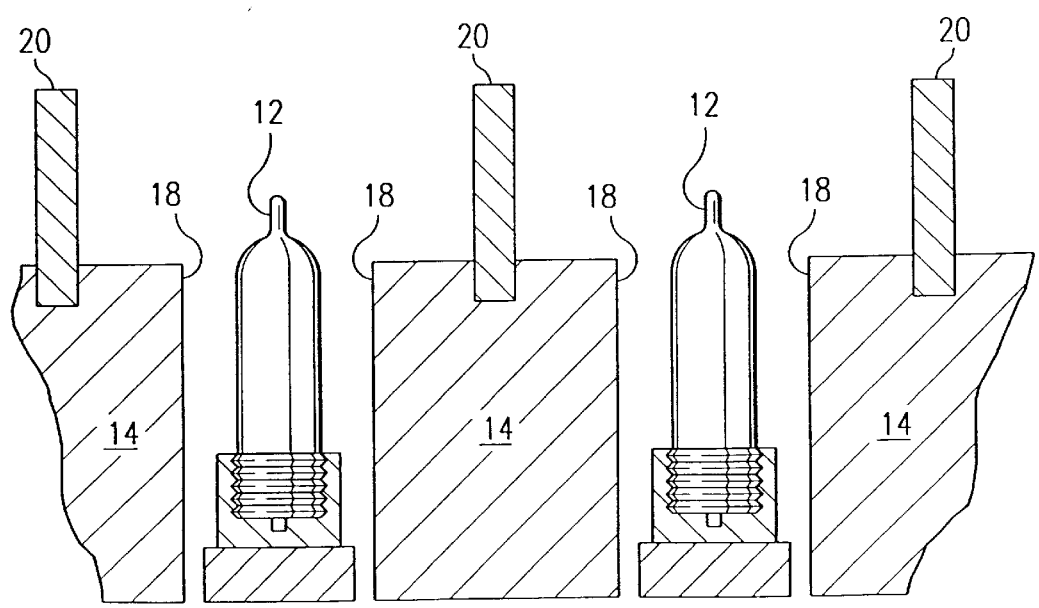
FIG. 3A is a schematic diagram of a possible heat lamp configuration within the reflective housing of the present invention.

Adequate separation between the multiple zones of heating is achieved by the design of the reflective housing 14 around the lamps 12 and the design of the optical spacers 20 between adjacent zones. As shown in FIG. 3A, the lamps (or bulbs) 12 are recessed into highly reflective housing spaces 18 to collimate the radiation emanating from the individual bulbs 12. The degree of collimation is a function of how deeply the bulbs are recessed within the housing spaces.

As shown in FIG. 3A, spacers 20 are placed on the illuminator housing 12 between adjacent lamps 12 (i.e., separating adjacent zones). Spacers 20 can also tailor the characteristics of lamp radiation. As the height of the spacers 20 increases, the separation between the radial zones increases to provide improved independent control of the temperature as function of radial position. However, the spacers 20 can have an excessive height that will lead to the detrimental effects of having too abrupt separation and the loss in reliability/life of the rings. As the spacer rings become too tall, the aspect ratio increases and the ability to cool the spacers using conductive method diminishes. At the same time, as the surface area of the rings increase, the radiation absorption from the lamps increases, raising the temperature of the rings to unacceptably high levels. The height of the reflective separation rings must balance the height and surface area considerations against the value of having increased separation. The spacers 20 are preferably optically reflective (e.g., via gold plating by evaporation or sputtering). The spacers 20 can be cooled from the coolant flowing in the base reflector and the forced air cooling provided as air travels through the bulb sockets.

Figure 3B:
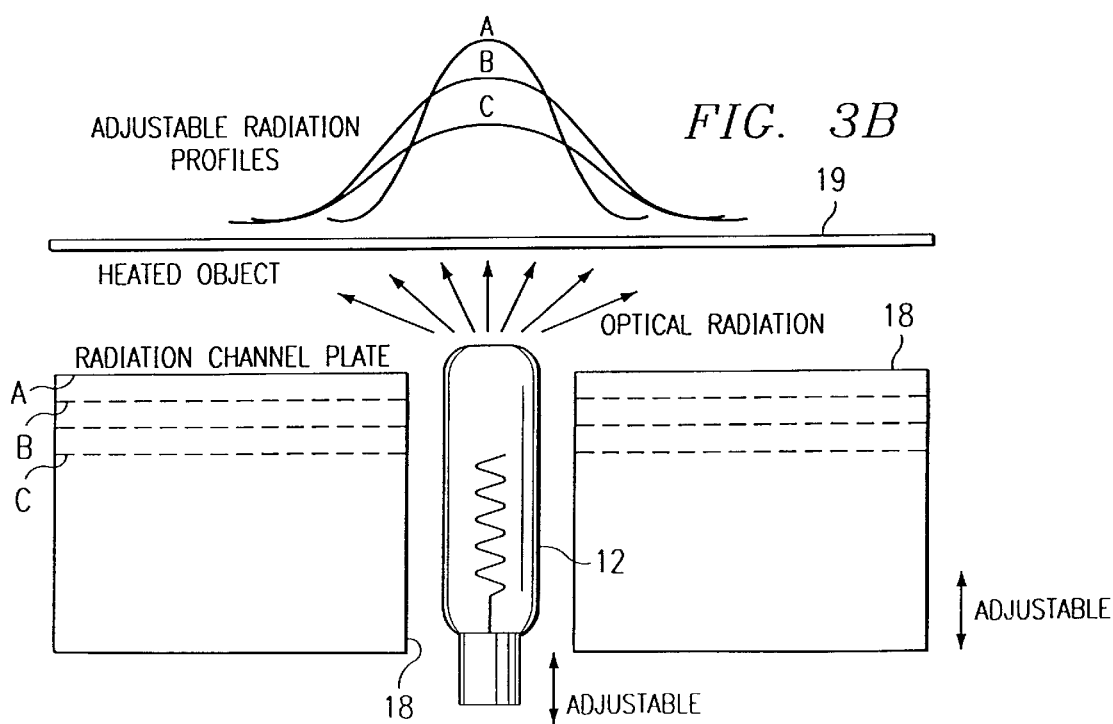
FIG. 3B shows an embodiment of a heat lamp that is adjustable up and down within the lamp cylinder housing that illustrates through radiation profiles the effect that recessing a bulb in a housing cylinder has on optical radiation emitted from the heat lamp.

As shown in FIGS. 3A and 3B, the lamp is recessed within cylinder housing 18. The lamp 12 can be adjustable so that it can be recessed at different heights within the cylinder housing as shown in FIG. 3B. The deeper a lamp 12 is recessed, the more collimated the light beam radiated to the substrate. The lines marked A, B, and C on FIG. 3B show three exemplary levels within cylinder housing 18 that lamp 12 can be recessed. When bulb 12 is at level C within cylinder housing 18, a narrow and highly collimated light beam is radiated at a heated object, such as a wafer 19. When lamp 12 is held at level A within cylinder housing 18, housing space 18 exposes more of light from lamp 12 to wafer 19.

As shown in FIG. 3B, the radiation profile from lamp 12 to wafer 19 changes depending on the level of the lamp 12 within the cylinder housing 18. The lines in FIG. 3C illustrate the radiation profiles for lamp 12 of FIG. 3B at levels A, B, and C. As shown in FIG. 3B, a more dispersed radiation pattern is applied to wafer 19 when the lamp 12 is held at level A, while a more narrow radiation pattern is applied when lamp 12 is held at level C. Determining the optimal position of the lamps 12 within the reflective housing space 18 requires balancing the detrimental effect of having too much collimation resulting in abrupt power changes between zones (and the reduction in the optical power) with the desirable effect of separating the radiation between illuminator zones.

Figure 4:
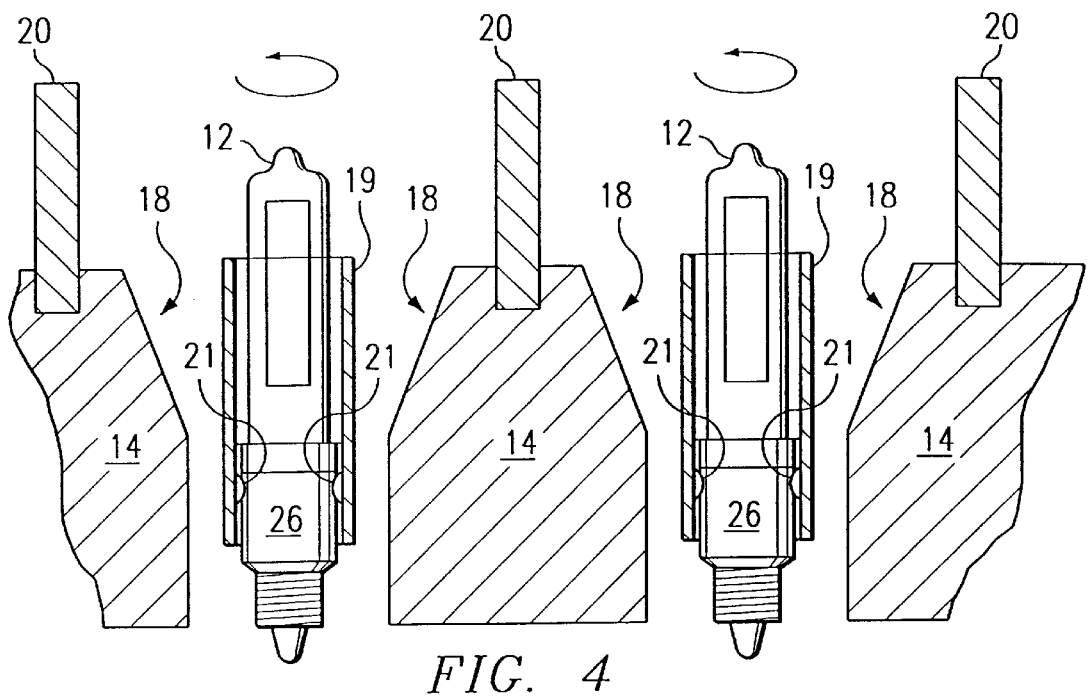
FIG. 4 shows a heat lamp socket configuration for improved heat transfer that includes cooling fingers and inclined cylinder housing walls according to one aspect of the present invention.

In an alternative embodiment depicted in FIG. 4, a conically-shaped housing cylinder 18 is used to increase the optical efficiency of bulbs 12 with collimation. The inclined walls of housing space 18 reflect a greater portion of light towards wafer 19 by redirecting light away from the cavity. The optical efficiency is enhanced by providing a reflective material on the outside surface of the inclined wall of housing space 18 at base 24 of light 12 so that light is redirected towards wafer 19 rather than absorbed. For instance, gold plating will provide high reflectivity without oxidation of the gold over time, although other reflective metals will also work.

FIG. 4 also depict direct contact fingers 21 which can provide cooling to optimize the life of bulb 12 by reducing the thermal stress which the bulb 12 receives. Fingers 21 act as a heat transfer device to allow heat to flow through a physical connection from lamp base 24 to illuminator housing 14. Fingers 21 can physically connect portions of bulb 12 which are subject to extreme thermal stress to other areas within the illuminator 10 that are easier to cool. These cooling fingers 21 can comprise any thermally conductive material, such as stainless steel, in order to promote the transfer of heat. As shown in FIG. 4, cooling fingers 21 can also contact a cooling jacket 19 that can have a coolant flowed though it in order to increase the transfer of heat from lamp 12 trhough cooling fingers 21.

Figure 5:
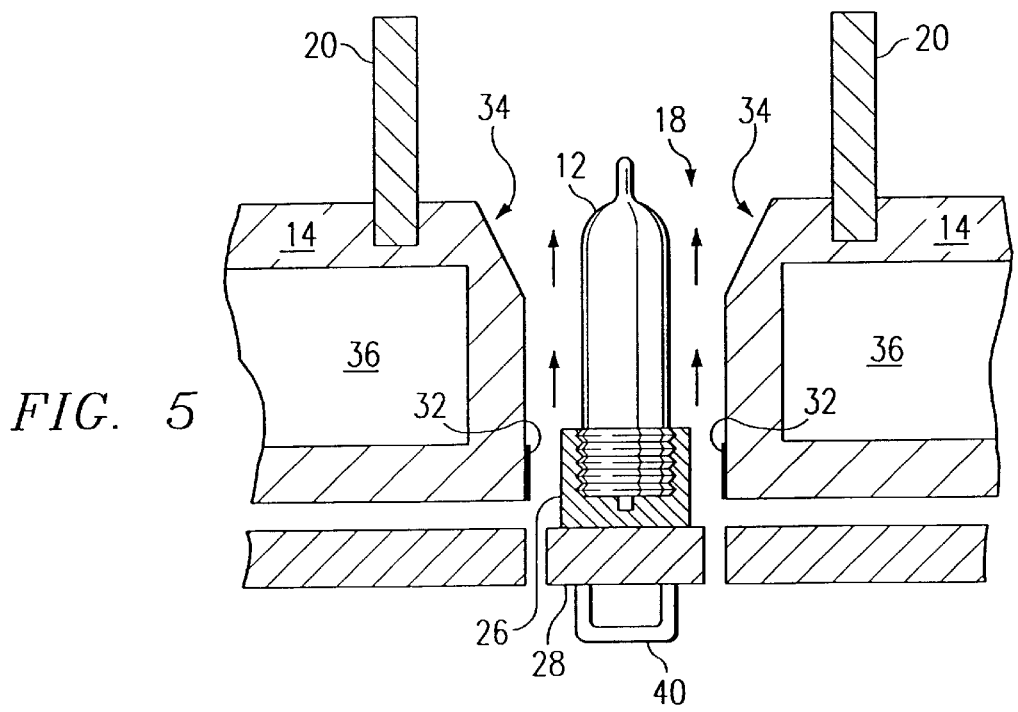
FIG. 5 illustrates lamp cooling provided by an embodiment of the present invention.

As shown in FIG. 5, the lamp base 24 of lamp 12 can also be cooled through control of the conduction, convection and radiation. Lamp base 24 can be screwed into socket 26. Socket 26 is rigidly clamped to a metallic socket plate 28 to aid in the transfer of heat from lamp base 24 through socket 26 to metallic socket plate 28. The socket plate 28 can include vent holes (not shown) around the socket 26 to cool the sockets by forced air convection. As shown in FIG. 5, the present invention can flow cool air flows across the sockets 26 prior to heat emitting from the lamp jacket 30 to provide cooling to the lamps 12. The air flows from the bottom of the housing spacing 22 (from socket 26 end) to the top of bulb cavity 22 and out of bulb cavity 22 on the spacer ring side of illuminator housing 14. Additionally, the housing space 18 can include a highly emissive area 34 that is coated with a highly emissive material to aid in the absorption of the radiation from the lamps 12. This highly emissive area 34 eliminates or greatly reduces the reflection of the filament energy from the lamp 12 into the socket 26 and lamp base 24.

Housing 14 that encloses the lamps 12 can also be both water and air cooled. As shown in FIG. 5, the water channel 36 allows cooling water to contact the housing 14 on the side opposite the lamp 12. The housing 14 is further cooled by the air flowing through the lamp cavity 22. Bulb cooling channel 40 also provides a path for cooling water to flow near bulb 12. The flow of the cooling fluids (water and air) provide cooling of both the cylinder and the lamps. The spacing between the lamp 12 and the housing space 18 is more constricted than the spacing between other parts (for example, the socket 26 or the socket base plate and the housing space 18) to ensure that the air flow rate in the multizone illuminator controlled by the lamp-cylinder spacing. The constriction between the lamp 12 and the housing space 18 forces the air flow velocity to increase to a maximum at that point to provide enhanced convective cooling. In addition, uniform flow rate is achieved in each bulb cavity 22, independent (to the first order) of the arrangement of air flow inside the multizone illuminator 10.

The present invention can force air flow in either direction within the housing space 18. As opposed to the flow arrows shown in FIG. 4, in situations where the heated air needs to be ducked out of the manufacturing environment, the cooling air flow passes around the bulbs, through the socket plate then out of the multizone illuminator assembly 10. The air flow can cooperate with fingers 21 to promote transfer of heat. Due to the thin diameter of fingers 21, the air flow experiences minimal interference as it passes by fingers 21.

Moreover, preferably the illuminator housing 14 has a number of hollow lightpipes 38 that provide through-holes for insertion of multipoint optical pyrometry temperature probes (and other probes) for real-time measurements and control of wafer temperature. The lightpipes 38 can be positioned adjacent lamps 12 in housing space 18 as shown in FIGS. 6 and 7. These lightpipes 38 preferably view the substrate/wafer surface through multiple holes (not shown) penetrated through the reflector surface of the illuminator housing 14 without interference from the optically reflective spacer rings 20. The illuminator housing 14, in its preferred embodiment, has a number of dummy (or reference) lamp cavities which are fully isolated from the actual heating lamps and from the radiative wafer in the process chamber.

As shown in FIGS. 6 through 8, the present invention can also include dedicated reference bulb cavities 52 within the housing assembly to accommodate reference or dummy bulbs 42. Reference bulbs 42 are used, in conjunction with lightpipes 38 and pyrometric sensors (not shown) to measure and compensate for changes in substrate emissivity and lamp interference. Lightpipes 38 and pyrometric sensors can measure the optical radiation from the reference lamps 42 at a particular wavelength to measure the temperature of the substrate. The reference bulb sensors (lightpipes and pyrometric sensors) measure both the DC and AC optical radiation from the reference lamps 42 to measure and compensate for emissivity and lamp interference effects. The maximum number of reference (or dummy) lamp cavities 52 is typically equal to the number of illuminator zones which are independently controlled by a dynamic multizone controller. The reference lamp cavities 52 are preferably placed around the peripheral region of the illuminator housing 14 so that they do not interfere with the heating zones.

The dedicated reference lamp cavities 52 within the illuminator housing 14 can also be used to house an extra bulb 12 when necessary. For example, if the number of bulbs 12 in a particular zone is even, to supply a reference bulb 42, an extra bulb must be supplied to allow two bulbs 12 to connect in series electrically. To accommodate this, an extra bulb 12 can be placed in a reference bulb cavity 52 and electrically connected to one of the bulbs 12 within the zone.

The reference bulb cavity 52 is designed as illustrated in FIGS. 6 and 7. The reference bulb 42 is enclosed within the reference bulb cavity 52 to minimize the optical radiation entering the cavity 52 that can interfere with the optical measurement made by the lightpipe 38. The optical radiation from the reference bulb 42, consisting of both slowly time varying (dc) and rapidly time varying (ac) signals, can be channeled by the lightpipe 38 into the optical detector (not shown) mounted on the bottom of the illuminator 10. FIG. 7 shows one embodiment of a multiprobe 37 that can include lightpipe 38 and electronic assembly 39 for performing measurements such as temperature measurements. The multiprobe 37 can connect to the multizone illuminator within dummy bulb cavity 52. The inner surface of the reference bulb cavity 52, in contrast to the bulb cavities 22, is not polished or coated with an optically reflective material to enhance the absorption of the radiation of the bulbs.

Figure 9:
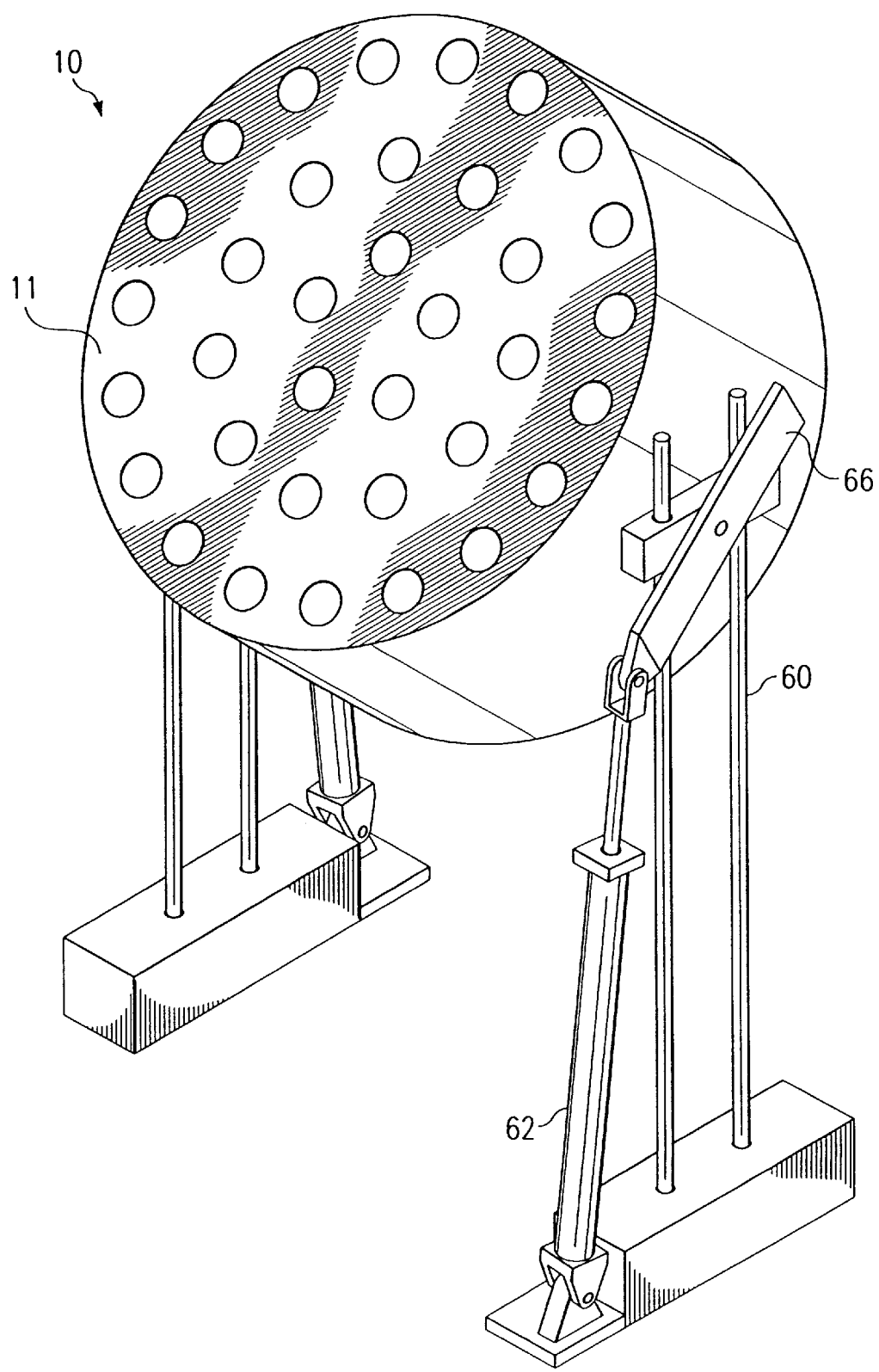
FIG. 9 illustrates mounting the illuminator assembly of the present invention on a pair of linear slides to allow horizontal and vertical movement of the illuminator.

The illuminator assembly 10 of the present invention is designed to provide enhanced serviceability, as shown in FIG. 9. FIG. 9 illustrates mounting the illuminator assembly 10 on a pair of linear slides 60 with the illuminator 10 counter balanced by pneumatic actuators 62. FIG. 9 also illustrates the lamp assembly 11 in a pivoted position around pivot assembly 66. The illuminator assembly 10 can be adjusted in both the horizontal and vertical position for optimum temperature controllability. The vertical distance of the illuminator (z-direction) from the substrate has an effect on opposing forces of the overlap (cross-talk) between the zones and the separability of the radiation between the zones. All other effects kept constant, the further the distance between the illuminator and the substrate, the greater the degree of overlap between the zones. This overlap in zones, in turn, results in a lower separation of the radiation from the zones.

The variation in the vertical distance from the substrate is achieved by positioning the illuminator along the linear slides 60. Upon determining the optimal vertical position, the illuminator can be rigidly locked in place. The balancing effect of the pneumatic actuators 62 also aid in preventing creeps in the vertical position. The horizontal position of the lamp can be adjusted by adjusting the base 68 of the two linear slides 62 which hold the illuminator assembly.

Figure 10:
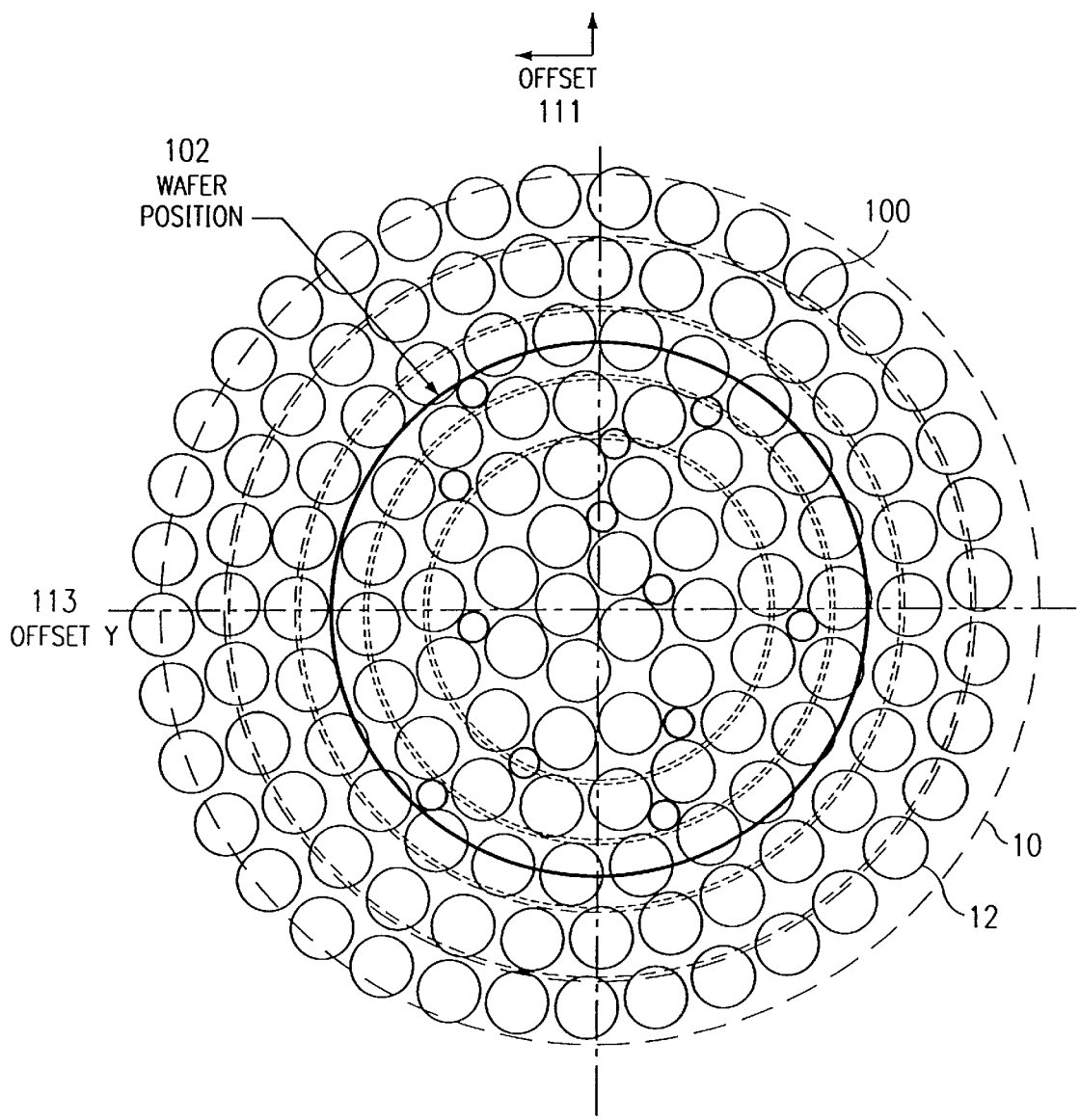
FIG. 10 illustrates the off-axis illumination according to one embodiment of the present invention.

FIG. 10 illustrates the off-axis illumination according to one embodiment of the present invention. In FIG. 10, the substrate position 102 is shown in relation to the illuminator 10. Illuminator 10 is a seven zone illuminator where lamps 12 have been placed in seven concentric circular zones about the center of illuminator 10. As shown, the illuminator has an offset with respect to the wafer (i.e., not centered directly over the wafer) in both the x and y directions. Thus, the center of the wafer is offset by a distance along the x axis from the center of the illuminator 10, the x direction offset 111, and the center of the substrate is offset by a distance along the y axis from the center of the illuminator 10, the y direction offset 113. The illuminator of FIG. 10 has a one-lamp center zone so that the center of the illuminator 10 is at the center of that lamp in the center zone. This movement of the illuminator in the horizontal plane (i.e., x and y directions) has an effect on the amount of wash-out in the thermal pattern during substrate rotation. With the illuminator placed exactly concentric with the substrate, the wash-out effect is negligible because the axisymmetric pattern of the bulbs will be maintained with substrate rotation.

In contrast, as shown in FIG. 10, if the center of the lamp assembly 10 is displaced from the center of rotation of the substrate, individual bulbs 12 in the illuminator 10 will illuminate varying radii on the substrate. During substrate rotation, the effect will be to wash-out (or broaden) the radiation profile of the illuminator 10. This effect is important in obtaining a good balance between the separation between the zones needed for real-time temperature uniformity control, and the smooth transition between the zones needed for intra-zone temperature uniformity.

Figure 14:
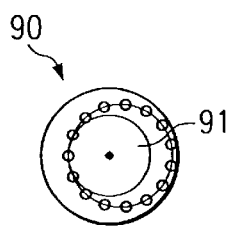
FIG. 14 shows an offset lamp assembly that places each bulb in a particular zone (ring) at a different radial position on the substrate.

The use of the lateral offset as shown in FIG. 10 is a critical element to the illuminator design. The present invention utilizes this technique to deliver distinct optical separation of the zones in terms of optical radiation, while achieving thermal smoothness across the substrate by rotating the substrate. As shown in FIG. 14, an offset lamp assembly 90 places each bulb 12 in a particular zone (ring) at a different radial position on the substrate. The center axis of the illuminator 10 can be offset from the axis of the wafer 91 by a fraction, such as one-half, of the inner-zone spacing, which generally equates to a distance of less than one inch. The diameter of illuminator 10 should be large enough to ensure full coverage of wafer 91, such as 50 to 100%. of the diameter of wafer 91. Rotating the offset lamp assembly 90 at a high enough rate can smooth out the effect of the varying bulb radius within a zone to provide a smooth thermal profile that, when combined with adjacent zones, provides uniform temperature distribution over the wafer. The duration of rotation required for an offset lamp system 90 to produce the desired effect should be shorter than the effective thermal time constant needed for the diffusion of heat between bulbs 12. In other words, the rotation, and therefore optical radiation averaging, can occur fast enough that the system provides a smooth thermal profile.

Figure 11:
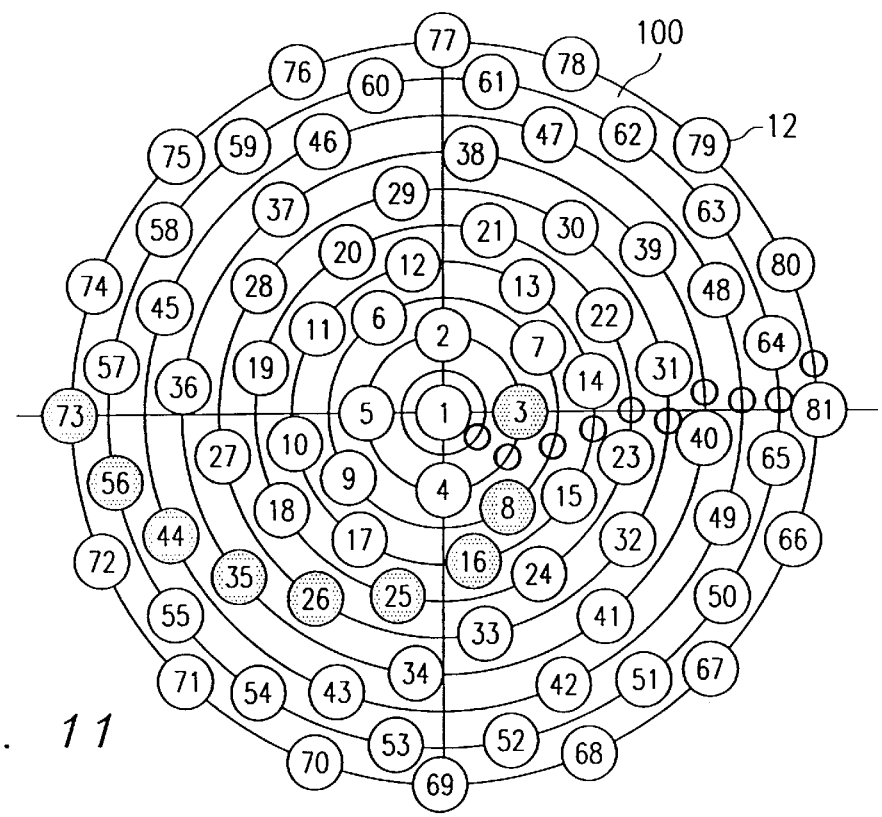
FIG. 11 schematically diagrams a lamp illustrating the individual lamp positions for a spiral configuration of the present invention having improved spatial resolution.
Figure 12:
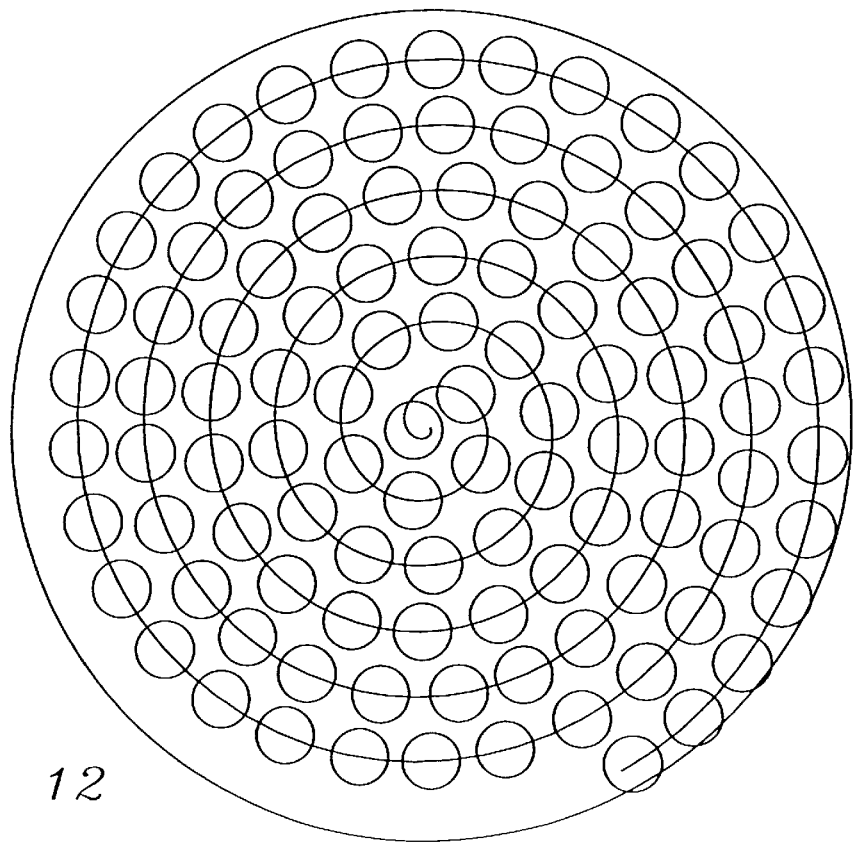
FIG. 12 further schematically diagrams the embodiment appearing in FIG. 11 to illustrate the spiral offset heating feature that provides improved spatial heating resolution.
Figure 13:
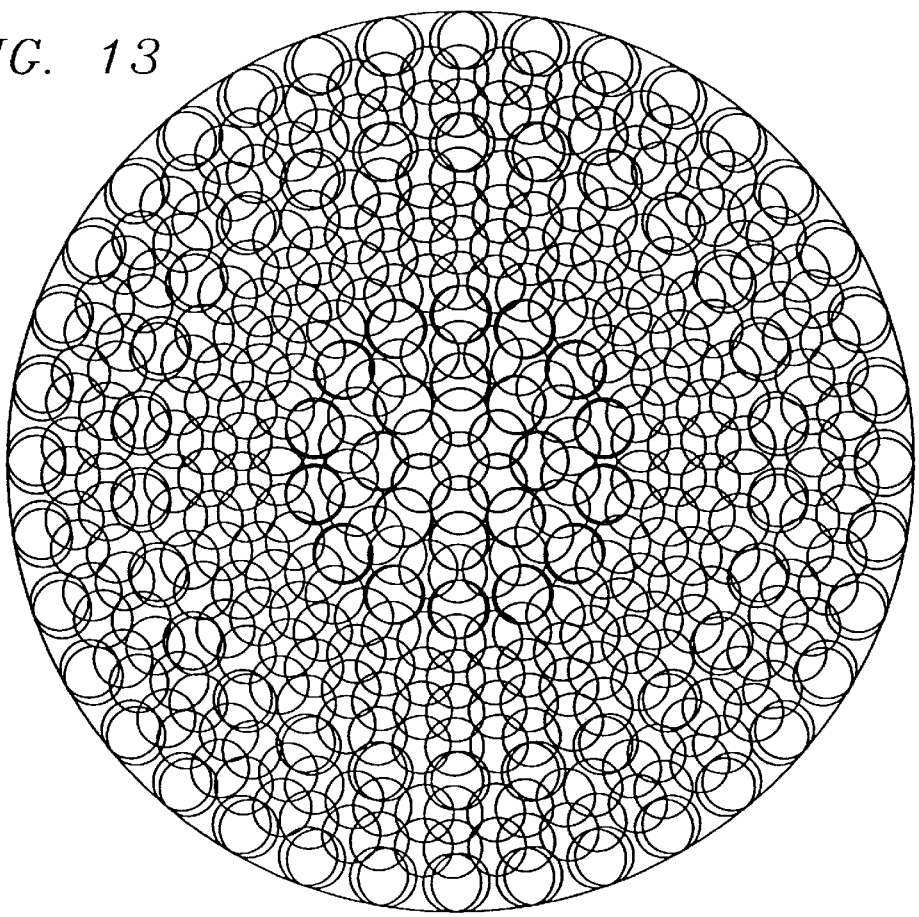
FIG. 13 shows a heating profile resulting from an illuminator having a spiral shape or an offset axis relative to a wafer further illustrating the higher degree of spatial which the present invention provides.

The intra-zone region 100, which is the distance between concentric rings of lamps 12 shown in FIG. 10 or of spiraled layers of lamps 12 as in FIGS. 11 through 13, defines the spatial resolution of illuminator 10. Each bulb 12 provides the greatest optical energy directly above it, with the optical energy decreasing away from bulbs, as depicted in FIG. 3B, for example. The separation between each zone thus affects the uniformity of the temperature distribution over the wafer. Because the typical lateral heat diffusion length on a wafer is smaller than typical zone separations, optimization of power levels between zones cannot completely remove intra-zone non-uniformities. Although intra-zone non-uniformities can be reduced by increasing the number of bulbs, this approach increases costs and decreases reliability.

FIGS. 11 through 13 depict another technique for removing intra-zone non-uniformities by altering the geometric relationship between the illuminator lamps 12 and the wafer being heated. As shown in FIG. 11, lamps 12 of illuminator 10 are placed in a spiral shape formation in which the lamps 12 form a curve winding around a centerpoint of illuminator 10 at an increasing radius. Various types of spiral configurations can be used to provide a desired density of lamps 12 at a given distance from the center of illuminator 10. For instance, the lamps 12 can form a logarithmic spiral, a hyperbolic spiral or a spiral of Archimedes, defined as a curve generated by a point having uniform motion around a fixed point combined with motion away from the fixed point. FIG. 12 traces the actual spiral 115 formed by the lamps 12 in FIG. 11. As shown, the zones of illumination formed by the spiral configuration of FIG. 12 are not concentric circles (in contrast to the zones of FIG. 9). In one alternative embodiment, a plurality of spiral-shaped formations for lamps 12 can be integrated on illuminator 10. In another alternative embodiment, the distance between the wafer and each lamp in the Z-direction can be altered to form one or more three dimensional coils.

Referring to FIG. 13, the distribution of optical energy 120 from an illuminator 10, having a spiral configuration of FIG. 12, to a wafer is depicted when the wafer rotates relative to illuminator 10. Each lamp 12 provides a spatial sweeping action with an independent radius relative to the center of rotation of the wafer. The variable radius of each lamp reduces the concentration of heating which can occur when the lamps are arranged in concentric circles. Thus, intra-zone heating irregularities are reduced, providing greater spatial resolution for a given number of lamps. The wafer gets a near constant time-averaged optical flux, thus reducing intra-zone non-uniformities and increasing spatial resolution. The distribution of optical flux depicted by FIG. 13 can be obtained by lateral offset, use of a spiral-shaped formation, or a combination of these techniques.

One advantage of the variable radius for each lamp provided by a spiral-shaped (or an offset spiral) illuminator 10 is that the number of zones for an illuminator 10 can be reconfigured after production of the illuminator 10. For instance, the spiral can be divided into separate zones based upon the degree of temperature control needed for a given wafer. Each zone can have a dimension or diameter adjusted to affect a predetermined portion of the wafer, with each zone receiving a variable power input dependent upon the temperature sensed for the zone's portion of the wafer. In fact, each lamp 12 can have its own zone defined by the lamp's position relative to the rotation of the wafer. Thus, precise post-production reconfiguration of heating zones will allow adaptation of an illuminator to have zones with specific diameters and dimensions according to the heating requirements of a given wafer. Further, an offset illuminator 10 can provide better spatial resolution for an illuminator 10 with concentric rings than is otherwise available for the finite spacing between the illuminator's lamps 12.

Figure 15:
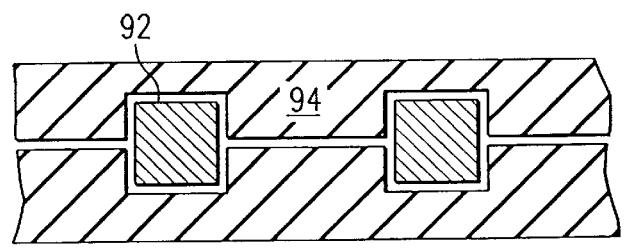
FIG. 15 demonstrates the easily removal of a light forming part of the lamp of the present invention.
Figure 16:
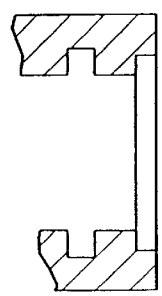
FIGS. 16 through 17 describe one method of forming the reflective plate of the present invention.
Figure 17:
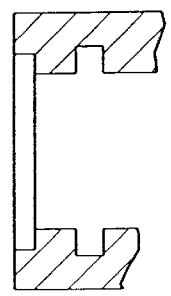

With reference, now, to FIGS. 15 through 17, the electrical connections to the lamps 12 are made on two electrical bus rings 92 for a single phase electrical power, and on three electrical bus rings 92 for three-phase electrical power. The electrical bus rings 92 are made of copper or other highly conductive material. The cross section of the bus rings 92 are large enough to provide adequate electrical conductance for given current requirements. The bus rings 92 have terminal points with tapped holes to secure the electrical leads from the bulbs 12. The bus ring 92 also has a larger capacity terminal point designed to secure the main electrical input.

Each ring of lamps (i.e., each zone) has a pair of electrical bus rings 92 for single phase operation or three electrical bus rings 92 for three-phase operation. For a five zone embodiment of the multizone illuminator of the present invention, the illuminator assembly 10 will have ten bus rings 92 for single phase operation and fifteen bus rings 92 for three-phase operation. The bus rings 92 are arranged in concentric patterns corresponding to the geometry of the illuminator zones. As shown in FIG. 16, the bus rings 92 are held rigidly in place by an insulator structure 94 that acts to clamp the bus rings 92. The insulating structure 94 can be rigidly fixed to the illuminator assembly housing 14.

The reflective plate 16 of the illuminator can be manufactured by welding tubes to top and bottom plates as shown in FIG. 17. The plates should have appropriate welding grooves and stress relief grooves built in. Alternatively, the reflective plate can be fabricated by welding or brazing a plate to a machined out assembly as shown in FIG. 17.

Figure 18:
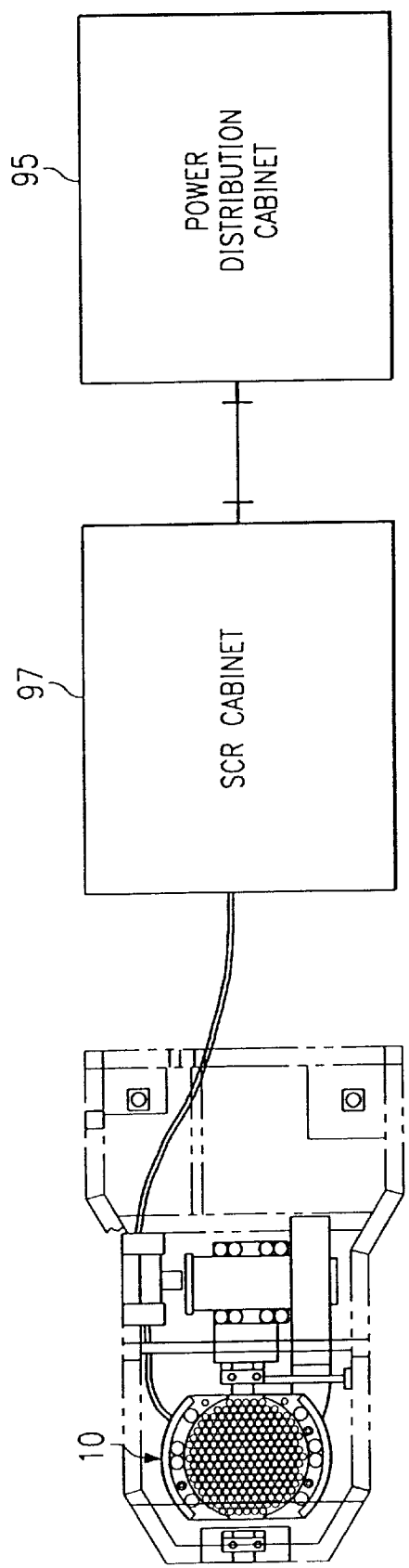
FIGS. 18 and 19 show the SCR control features of the spiral configuration for improved spatial resolution appearing in FIGS. 11 and 12.
Figure 19:
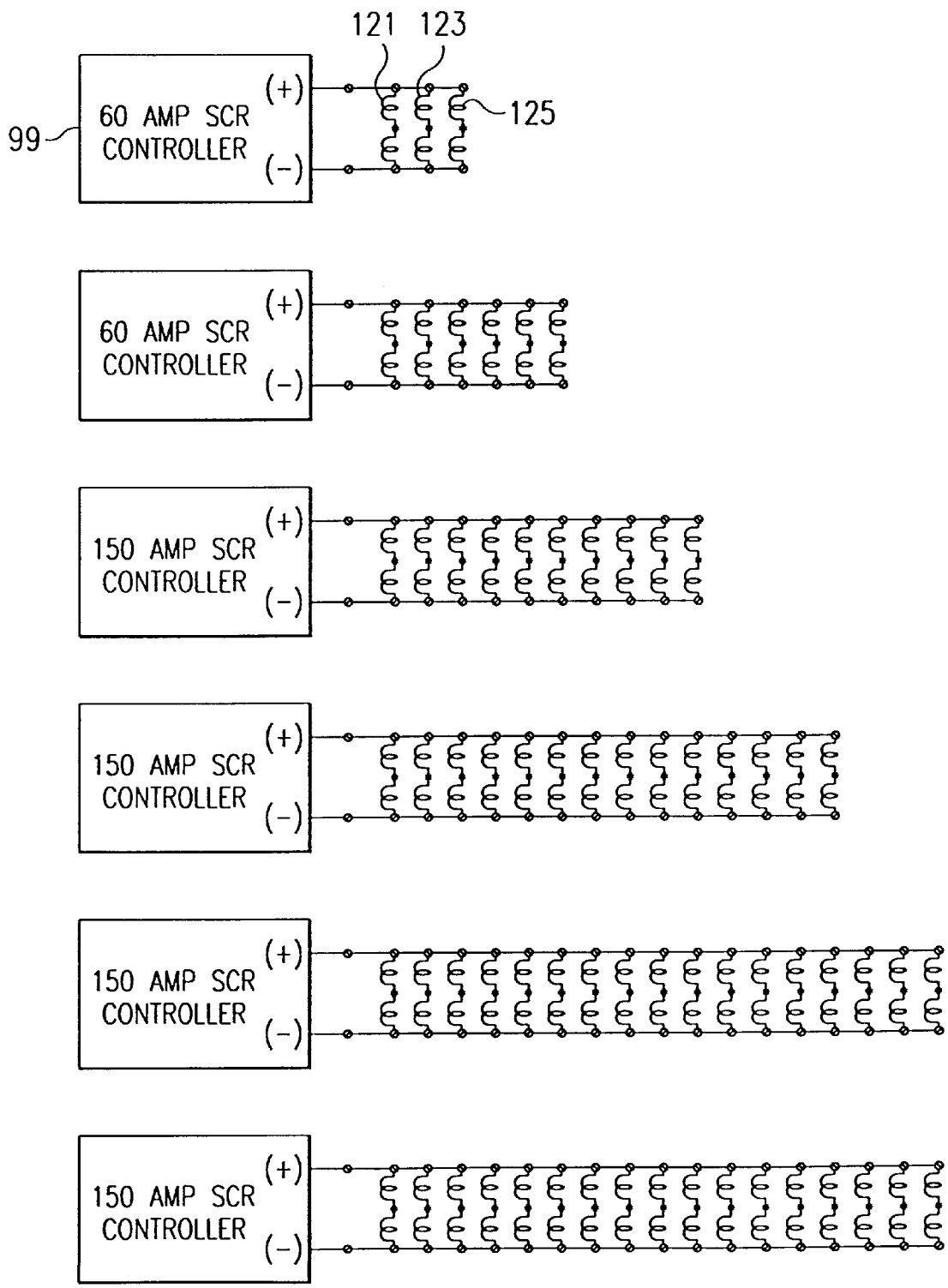

FIGS. 18 and 19 show the SCR (silicon control rectifier) controller circuitry for control circuitry for controlling the lamps 12 of the spiral offset illuminator of FIGS. 11 through 13. In particular, FIG. 18 shows power distribution cabinet 95, which provides power to SCR cabinet 97. SCR cabinet 97 includes numerous SCR controller circuits 99 shown in FIG. 19. Control output from SCR cabinet 97 goes to illuminator 10 within process module 101. As FIG. 19 depicts, SCR controller 99 provides illumination power to lamps 121 through 125. Lamps 121 through 131 are the inner-most lamps 1 through 3 appearing in FIG. 11. Likewise, SCR controller 101 provides rectified power to lamps 4 through 9 of FIG. 11. The result is that as the zones or segments of spiral offset illuminator 10 become increasingly large, the number of lamps that a SCR controller controls increases until, for example, at SCR controller 103 a maximum number of 17 lamps are controlled.

Figure 20:
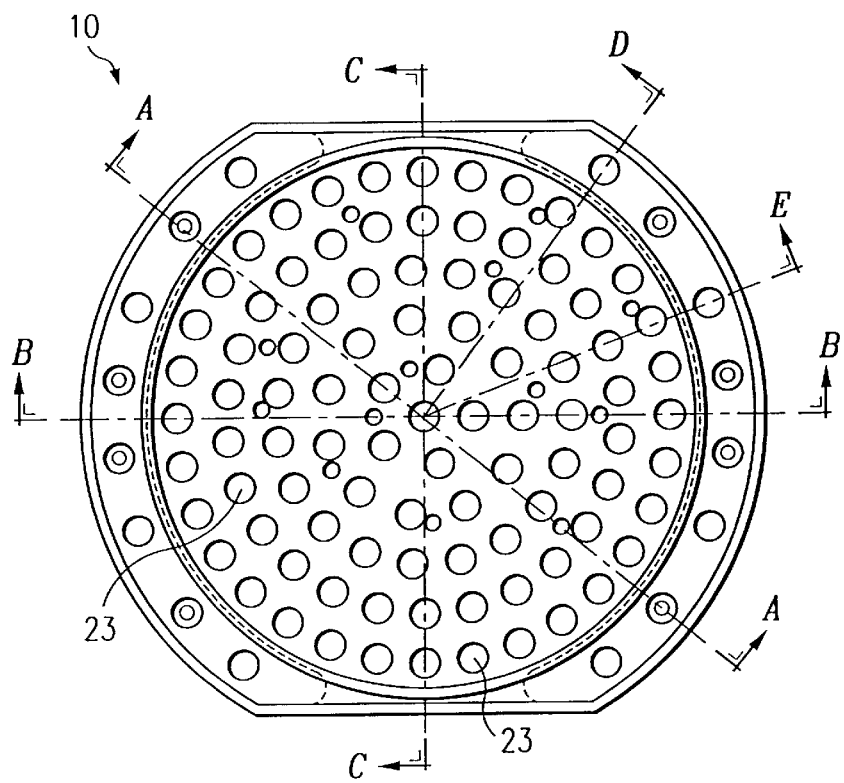
FIG. 20 shows a top view of the spiral embodiment of a lamp assembly that can be used with the present invention.
Figure 22:
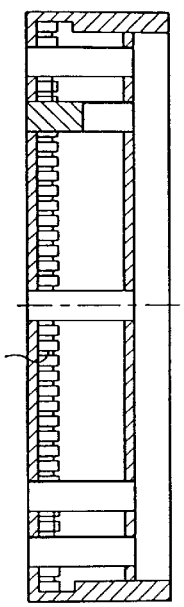
FIG. 22 shows a side view of the embodiment of FIG. 20 along section line B—B that shows a tube lamp feedthrough.
Figure 21:
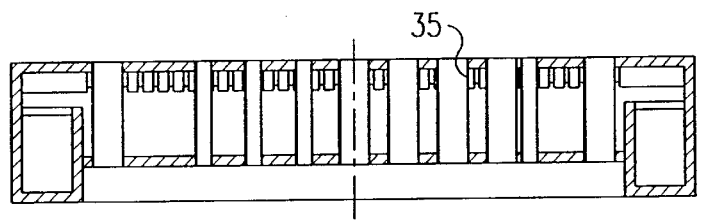
FIG. 21 shows a side view of the embodiment of FIG. 20 along section line A—A showing a pyrometry sensor feedthrough.
Figure 23:
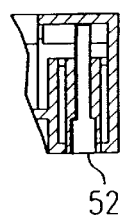
FIG. 23 shows a partial side view of the embodiment of FIG. 20 along section line C—C that shows a dummy bulb cavity.
Figure 24:
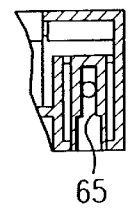
FIG. 24 shows a partial side view of the embodiment of FIG. 20 along section line D—D that shows a water tube.

FIGS. 20–24 show an embodiment of the illuminator 10 that illustrates many of the features described. FIG. 20 shows a top view of illuminator 10 that shows five concentric rings of lamp feed throughs 23. FIG. 21 shows a side view of the embodiment of FIG. 20 along section line A—A that shows a pyrometry sensor feedthrough 35 for receiving a pyrometry sensor. FIG. 22 shows a side view of the embodiment of FIG. 20 along section line B—B that shows tube lamp feedthrough 45 for receiving a lamp 12. FIG. 23 shows a partial side view of the embodiment of FIG. 20 along section line C—C that shows a dummy bulb cavity 52 for receiving a dummy or reference bulb 42 and a light pipe 38. FIG. 24 shows a partial side view of the embodiment of FIG. 20 along section line D—D that shows a water tube 65 for providing cooling water to cool dummy or reference bulb 42 and light pipe 38.

Figure 25:
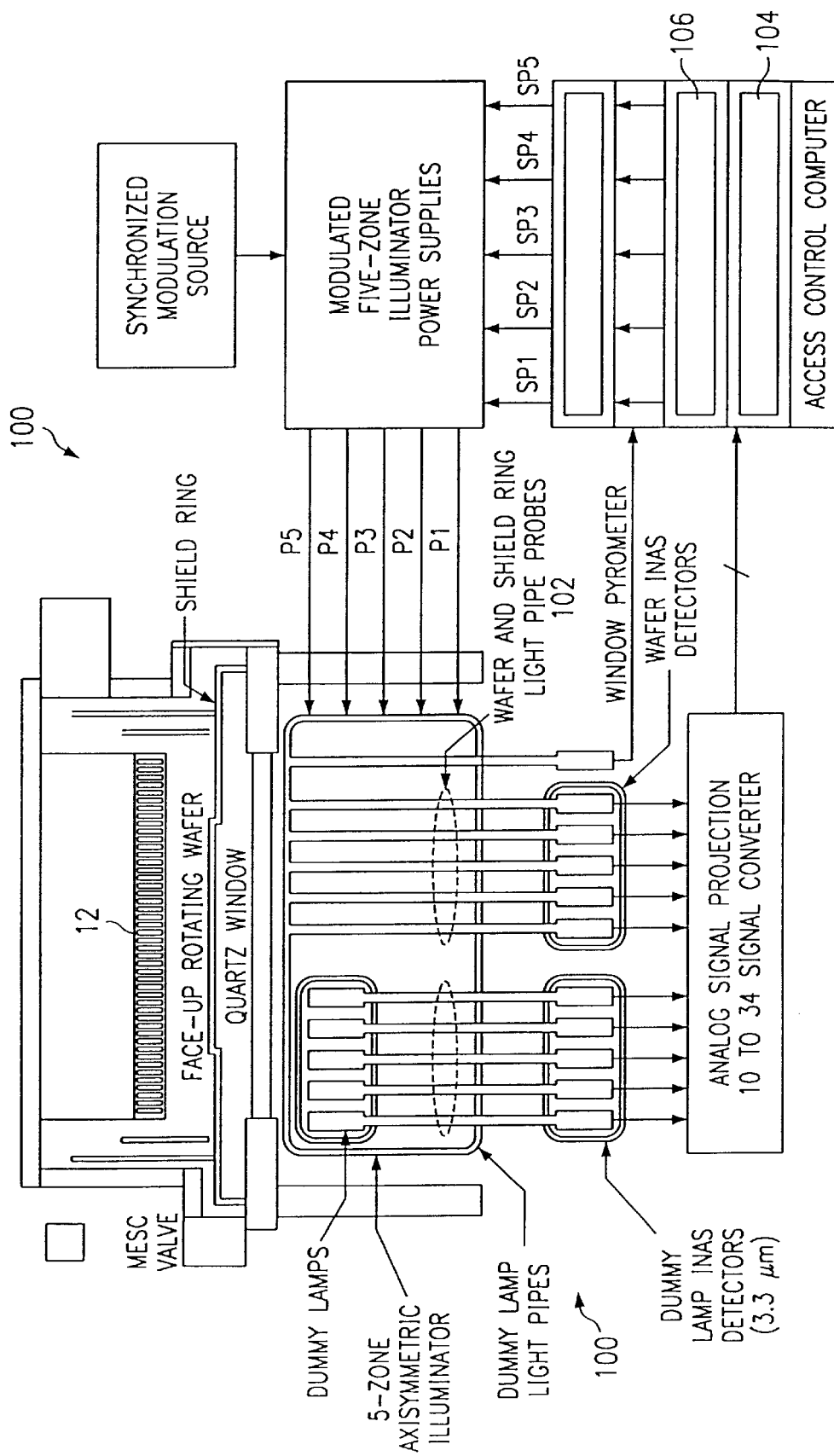
FIG. 25 shows a high level diagram of the present invention incorporating temperature sensors and other temperature control and measurement devices into a multizone illuminator.
Figure 26:
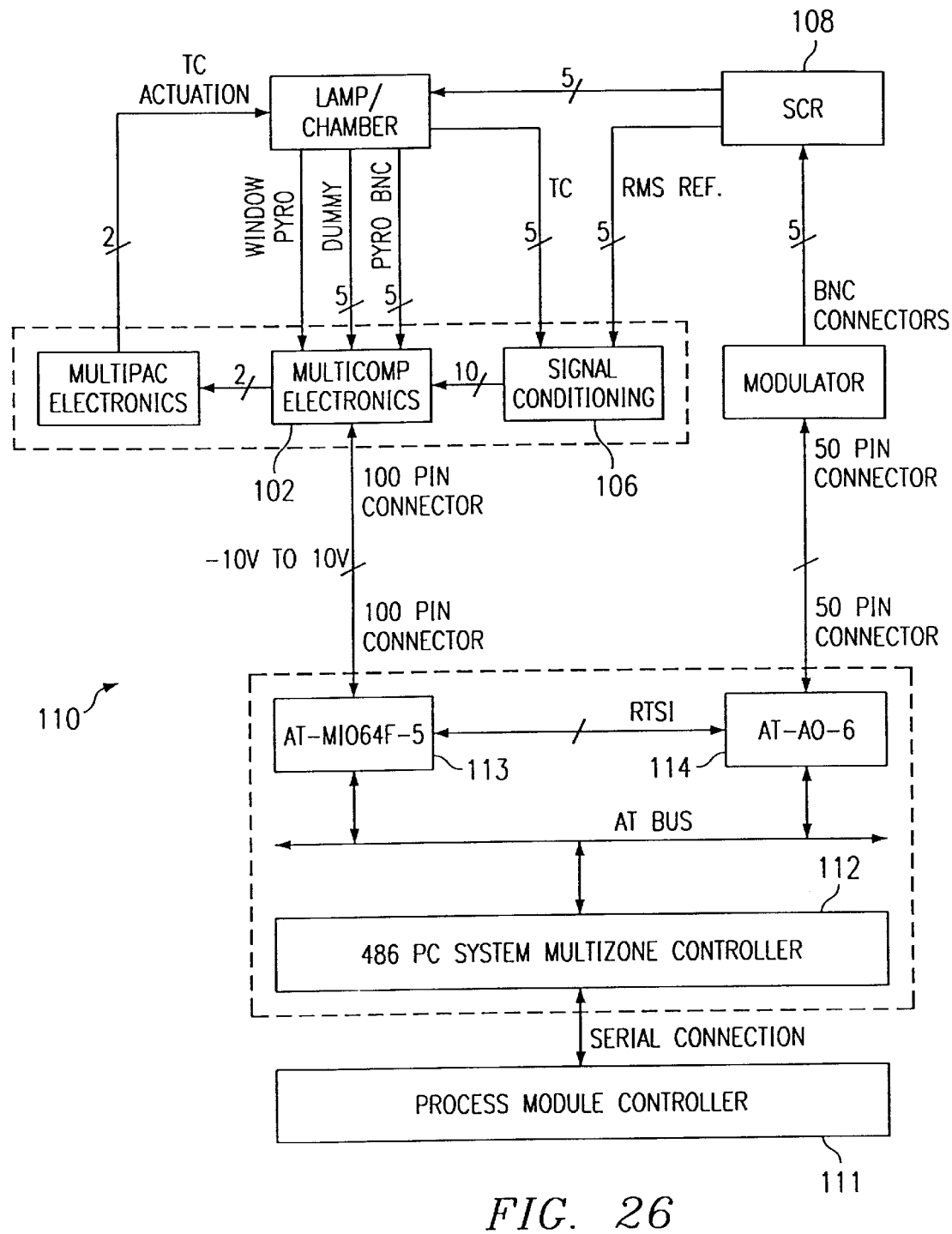
FIG. 26 is a block diagram illustrating the temperature measurement and control architecture of an embodiment of the present invention.

The present invention also comprises a temperature measure and control system that incorporates into the multizone illuminator 10. The temperature measurement and control system 100 shown in FIGS. 25 and 26 to include multizone pyrometers 102 (MultiProbe™), a multizone emissivity and lamp interference correction system 104 (MultiComp), a dynamic model-based multizone temperature controller 106 (DynaZone), and multizone SCR's 108, as well as multizone lamps 12 and a multizone pyrometer calibration system 109 (MultiPAC). The multizone MultiComp™ system measures the real-time emissivity and lamp interference in each zone and provides wafer temperature adjusted for the emissivity and lamp radiation. The MultiComp™ system uses the radiation from the lamps as the reference source and the pyrometers as the detectors. Thus, the emissivity and lamp interference detector provides correction values corresponding to the exact spectral sensitivity of the detectors used to measure temperature. The detector also provides the emissivity and lamp interference value with identical spatial sensitivity and view factors as the pyrometers. The MultiProbe™, which consists of the light pipe and front-end detection electronics are designed to provide maximum optical efficiency and stability at a range of 1 to 3.5 $\mu$m. In the particular system, wavelength of 2.5 $\mu$m was used. To compensate for the thermal effects of the quartz window between the heating lamp and the wafer, a pyrometer which operates at the absorptive band of quartz is used (8–14 $\mu$m). This is used to partially correct for the finite emissivity of quartz at 2.5 $\mu$m, as well as to provide a more efficient control algorithm. MultiPAC™ allows an automated calibration of the pyrometers with reference thermocouples. Instead of using TC instrumented wafers which are fairly expensive and require partial disassembly of the equipment, the MultiPAC™ system allows an automated sequence of pyrometer calibration without breaking vacuum. The temperature control system 100 of the present invention provides temperature control of ±2° C., 3σ during steady state and ±5° C., 3σ during ramps of 50° C./sec to 100° C./sec. Temperature control will be operational at temperatures above 400° C.

Temperature measurement system 100 of the multizone illuminator of the present invention can be controlled through a Pentium or 486-based computer through A/D, D/A and digital I/O ports. There are interface electronics in between the computer and the various sensors and electronics. The control architecture 110 for temperature measurement and control is presented in FIG. 26. The remainder of the description of temperature control and measurement will describe a five zone illuminator. It should be understood that the present invention can operate over other multiple zone illumination arrangements.

The process module controller 111 (PMC) initiates a thermal process cycle by providing the multizone temperature controller 112 (MZC) a recipe for a desired temperature profile through a serial connection. The recipe will consist of a sequence of numerical values and control characters. Typical information provided by the PMC would consist of, for example, a command which states "ramp up at 50° C./sec to 500° C. and hold for 20 seconds, ramp up at 50° C./sec to 900° C. and hold for 180 seconds, ramp down at 30° C./sec. The MZC 112 takes the recipient information from the PMC 111 and executes the recipe based on sensor and model data.

The interface from the MZC to the control and actuation electronics is established through circuit boards. The circuit board 113 is used primarily to obtain ten pyrometer readings (ten total readings from 5 multizone measurements and 5 lamp measurements in a five zone configuration), five MultiPAC thermocouple reference readings, and five RMS power readings from the SCR's. Actuation signals to control the position of the MultiPAC probes are also provided by board 113. The circuit board 114 is used primarily as a digital to analog converter to provide the five control signals to the multizone SCR'S. In addition to the analog signal interface, the board 113 handles low level interlocks that require fast reaction time. These interlocks are handled by the MZC 112 (as opposed to the PMC).

The MultiComp system can solve a 15×10 system of equations for ten variables for a five zone RTP. For an "n" zone RTP, the MultiComp system solves a 3n×2n system of equations for 2n variables. In a five zone system five of the variables are the adjusted wafer radiance from the five zones of the wafer and a guard ring (e.g. SiC ring). The remaining five variables provide measurements of wafer reflectivity as seen by the five detectors. The reflectance measurement in conjunction with either a real-time or analytical transitivity value can be used to obtain a real-time, in-situ measurement of wafer emissivity. The MultiComp™ provides an integrated solution to the two largest problems in pyrometric temperature measurements—lamp radiation interference and emissivity ariations.

Although the present invention has been described in detail, it should be understood that various changes, substitutions and alterations can be made hereto without departing from the spirit and scope of the invention as defined by the appended claims.

What is claimed is:

1. An illuminator for use in rapid thermal processing of a substrate, the illuminator comprising:
    a geometric center;
    a plurality of heat lamps disposed within the illuminator to direct optical energy at the substrate, the heating lamps forming a spiral shape, wherein the spiral shape is a spiral of Archimedes; and
    wherein the substrate rotates relative to the illuminator.

2. The illuminator of claim 1, wherein the substrate rotates about a rotation axis, and further wherein the rotation axis is offset from the geometric center of the substrate.

3. The illuminator of claim 1, wherein each heating lamp is located a distance from the geometric center of the illuminator, and further wherein the distance each heating lamp is located from the geometric center of the illuminator is distinct.

4. The illuminator of claim 1, wherein the illuminator comprises a plurality of cavities for holding each of the plurality of heating lamps, and further wherein at least one of the cavities has an inclined wall for enhancing reflection of optical energy to the substrate.

5. The illuminator of claim 4, wherein the cavity has a conical shape.

6. The illuminator of claim 1, wherein the illuminator comprises a plurality of cavities for holding each of the plurality of heating lamps, and further wherein at least one of the cavities has a reflective material to enhance reflection of optical energy to the substrate.

7. The illuminator of claim 1, further comprising a plurality of contact devices in contact with at least one of the plurality of heat lamps and coupled to the illuminator, the plurality of contact devices providing direct cooling to the at least one heat lamp.

8. The illuminator of claim 7, wherein the contact devices comprise stainless steel fingers.

9. An illuminator for use in rapid thermal processing of a substrate, the illuminator comprising:
    a geometric center;
    a plurality of heat lamps disposed within the illuminator to direct optical energy at the substrate, the heating lamps forming a spiral shape; and
    wherein the substrate rotates relative to the illuminator and, wherein the diameter of the illuminator is at least fifty percent larger than the diameter of the substrate.

10. The illuminator of claim 1, further comprising:
    a multizone temperature measurement system, comprising a plurality of pyrometry sensors coupled to said multizone illuminator; and
    circuitry for real-time measurement and compensation of substrate emissivity and illuminator lamp light interference effects.

11. An illuminator for performing a rapid thermal processing of a substrate, comprising;
    a plurality of heating lamps for generating optical power for rapidly heating the substrate; and
    a contact heating mechanism for each of the plurality of lamps operable to transfer heat from each of said heating lamps, thereby improving thermal performance of said heating lamps, wherein the diameter of the illuminator is at least fifty percent larger than the diameter of the substrate.

12. The illuminator of claim 11, wherein the contact heating mechanism comprises a plurality of fingers coupled to the illuminator and in contact with each of the heating lamps to provide direct contact cooling of each of the heating lamps.

13. The illuminator of claim 12, further comprising a water cooled jacket heat sink thermally connecting to each of said heating lamps through associated ones of said plurality of fingers.

14. The illuminator of claim 11, wherein the illuminator is for use in rapid thermal processing of a substrate, and further wherein the illuminator has a geometric center and the plurality of heat lamps are disposed within the illuminator to direct optical energy at the substrate, and further wherein the heating lamps forming a spiral shape and the substrate rotates relative to the illuminator.

15. The illuminator of claim 14, wherein the substrate rotates about a rotation axis, and further wherein the rotation axis is offset from the geometric center of the substrate.

16. The illuminator of claim 14, wherein each heating lamp is located a distance from the geometric center of the illuminator, and further wherein the distance each heating lamp is located from the geometric center of the illuminator is distinct.

17. The illuminator of claim 14, wherein the illuminator comprises a plurality of conically shaped cavities for holding each of the plurality of heating lamps, and further wherein at least one of the cavities has an inclined wall for enhancing reflection of optical energy to the substrate.

18. The illuminator of claim 14, wherein the illuminator comprises a plurality of cavities for holding each of the plurality of heating lamps, and further wherein at least one of the cavities has a reflective material to enhance reflection of optical energy to the substrate.

19. The illuminator of claim 11, further comprising:
a multizone temperature measurement system, comprising a plurality of pyrometry sensors coupled to said multizone illuminator; and
circuitry for real-time measurement and compensation of substrate emissivity and illuminator lamp light interference effects.

20. A system for rapid thermal processing of a substrate, the system comprising:
an illuminator having a plurality of zones and a geometric center;
a plurality of heating lamps disposed in the plurality of zones to direct optical energy at the substrate, the plurality of heating lamps forming a spiral shape, wherein the spiral shape comprises a spiral of Archimedes;
a plurality of heating lamp power supplies, each of the plurality of power supplies associated with one of the plurality of zones;
a temperature measurement system for measuring heating of the substrate;
a temperature controller associated with the plurality of power supplies and the temperature controller adjusting the power of each power supply to provide real-time temperature control; and
wherein the substrate rotates relative to the illuminator.

21. The system according to claim 20 wherein the substrate rotates about a rotation axis, and further wherein the rotation axis is offset from the geometric center of the illuminator.

22. The system according to claim 20 wherein each heating lamp is located at a distance from the geometric center of the illuminator, and further wherein the distance of each lamp from the geometric center of the illuminator is distinct.

23. The system according to claim 20 wherein the illuminator comprises a plurality of cavities for holding each of the plurality of heating lamps, and further wherein at least one of the plurality of cavities has an inclined wall for enhancing reflection of optical energy from the heating lamp to the substrate.

24. The system according to claim 20 wherein the illuminator comprises a plurality of cavities for holding each of the plurality of heating lamps, and further wherein at least one of the plurality of cavities has a reflective material to enhance reflection of optical energy from the heating lamp to the substrate.

25. The system according to claim 24 wherein the reflective material comprises gold.

26. The system according to claim 25 wherein the cavity has a conical shape.

27. The system according to claim 20 further comprising a plurality of fingers associated with at least one of the plurality of heating lamps and the illuminator, the plurality of fingers providing direct contact cooling of the at least one heating lamp.

28. The system according to claim 27 wherein the fingers comprise stainless steel.

29. The system according to claim 20 wherein the temperature control system, the temperature measurement system, the plurality of heating lamp power supplies and the plurality of heating lamps cooperate to provide reconfiguration of the zones of the illuminator.

30. A system for rapid thermal processing of a substrate, the system comprising:
an illuminator having a plurality of zones and a geometric center;
a plurality of heating lamps disposed in the plurality of zones to direct optical energy at the substrate, the plurality of heating lamps forming a spiral shape
a plurality of heating lamp power supplies, each of the plurality of power supplies associated with one of the plurality of zones;
a temperature measurement system for measuring heating of the substrate;
a temperature controller associated with the plurality of power supplies and the temperature controller adjusting the power of each power supply to provide real-time temperature control; and
wherein the substrate rotates relative to the illuminator and wherein the diameter of the illuminator is at least fifty percent larger than the diameter of the substrate.

31. A system for rapid thermal processing of a substrate, the system comprising:
an illuminator having a plurality of zones and a geometric center;
a plurality of heating lamps disposed in the plurality of zones to direct optical energy at the substrate;
a plurality of heating lamp power supplies, each of the plurality of power supplies associated with one of the plurality of zones;
a temperature measurement system for measuring heating of the substrate;
a temperature controller associated with the plurality of power supplies and the temperature measurement system, the temperature controller adjusting the power of each power supply to provide real-time temperature control; and
wherein the substrate rotates about a rotation axis, the rotation axis being laterally offset from the geometric center of the illuminator and wherein the diameter of the illuminator is at least fifty percent larger than the diameter of the substrate.

32. The system according to claim 31 wherein each zone is separated by an inter-zone spacing, and further wherein the substrate rotation axis is offset from the geometric center of the illuminator by a distance proportional to the inter-zone spacing.

33. The system according to claim 31 wherein the heating lamps are arranged in a spiral formation.

34. The system according to claim 31 wherein each heating lamp is located at a distance from the geometric center of the illuminator, and further wherein each distance of each lamp is unequal.

35. The system according to claim 31 wherein the illuminator comprises of a plurality of cavities for holding each of the plurality of heating lamps, and further wherein at least one of the plurality of cavities has an inclined wall for enhancing reflection of optical energy from the heating lamp to the substrate.

36. The system according to claim 31 wherein the illuminator comprises a plurality of cavities for holding each of the plurality of heating lamps, and further wherein at least one of the plurality of cavities has a reflective material to enhance reflection of optical energy from the heating lamp to the substrate.

37. The system according to claim 36 wherein the reflective material comprises gold.

38. The system according to claim 37 wherein the cavity has a conical shape.

39. The system according to claim 31 further comprising a plurality of fingers associated with at least one of the plurality of heating lamps and the illuminator, the plurality of fingers providing direct contact cooling of at least one heating lamp.

40. The system according to claim 39 wherein the fingers comprise stainless steel.

41. The system according to claim 31 wherein the temperature control system, the temperature measurement system, the plurality of heating lamp power supplies and the plurality of heating lamps cooperate to provide reconfiguration of the zones of the illuminator.

42. The illuminator of claim 9, wherein the substrate rotates about a rotation axis, and further wherein the rotation axis is offset from the geometric center of the substrate.

43. The illuminator of claim 9, wherein each heating lamp is located a distance from the geometric center of the illuminator, and further wherein the distance each heating lamp is located from the geometric center of the illuminator is distinct.

44. The illuminator of claim 9, further comprising a plurality of contact devices in contact with at least one of the plurality of heat lamps and coupled to the illuminator, the plurality of contact devices providing direct cooling to the at least one heat lamp.

45. The illuminator of claim 9, wherein the spiral shape is the spiral of Archimedes.

46. The system according to claim 30 wherein the substrate rotates about a rotation axis, and further wherein the rotation axis is offset from the geometric center of the illuminator.

47. The system according to claim 30 wherein each heating lamp is located at a distance from the geometric center of the illuminator, and further wherein the distance of each lamp from the geometric center of the illuminator is distinct.

48. The system according to claim 30 wherein the illuminator comprises a plurality of cavities for holding each of the plurality of heating lamps, and further wherein at least one of the plurality of cavities has an inclined wall for enhancing reflection of optical energy from the heating lamp to the substrate.

* * * * *